(12) United States Patent
Kegasa et al.

(10) Patent No.: US 7,492,194 B2
(45) Date of Patent: Feb. 17, 2009

(54) OSCILLATOR INCLUDING PHASE FREQUENCY DETECTORS FOR DETECTING A PHASE DIFFERENCE BETWEEN TWO INPUT SIGNALS AND OUTPUTTING A CONTROL COMMAND SIGNAL

(75) Inventors: Koyo Kegasa, Kobe (JP); Chitaka Manabe, Kobe (JP)

(73) Assignee: Kobe Steel, Ltd., Hyogo (JP)

( * ) Notice: Subject to any disclaimer, the term of this patent is extended or adjusted under 35 U.S.C. 154(b) by 0 days.

(21) Appl. No.: 11/404,762

(22) Filed: Apr. 17, 2006

(65) Prior Publication Data
US 2006/0181354 A1    Aug. 17, 2006

Related U.S. Application Data

(62) Division of application No. 10/702,635, filed on Nov. 7, 2003, now Pat. No. 7,061,330.

(30) Foreign Application Priority Data

| Feb. 19, 2003 | (JP) | ............................. 2003-040891 |
| Jun. 23, 2003 | (JP) | ............................. 2003-177427 |

(51) Int. Cl.
    *H03L 7/06* (2006.01)
(52) U.S. Cl. ........................................ 327/156; 331/56
(58) Field of Classification Search ................ 327/156, 327/2; 331/56
    See application file for complete search history.

(56) References Cited

U.S. PATENT DOCUMENTS

| 3,893,042 | A | * | 7/1975 | Whitman et al. ............... 331/55 |
| 4,528,522 | A | * | 7/1985 | Matsuura ........................ 331/2 |
| 4,686,482 | A | * | 8/1987 | Zoetman et al. ............. 327/156 |
| 5,113,152 | A |   | 5/1992 | Norimatsu |
| 5,216,387 | A |   | 6/1993 | Telewski et al. |
| 5,254,959 | A |   | 10/1993 | Wünsch |
| 5,391,996 | A | * | 2/1995 | Marz ........................... 327/158 |
| 5,422,604 | A | * | 6/1995 | Jokura ............................ 331/2 |
| 5,434,887 | A | * | 7/1995 | Osaka ........................ 375/295 |
| 5,506,531 | A | * | 4/1996 | Jang et al. .................... 327/156 |
| 6,192,094 | B1 |   | 2/2001 | Herrmann et al. |

(Continued)

FOREIGN PATENT DOCUMENTS

CN    480827    5/2000

(Continued)

*Primary Examiner*—Kenneth B. Wells
(74) *Attorney, Agent, or Firm*—Reed Smith LLP; Juan Carlos A. Marquez, Esq.

(57) ABSTRACT

An oscillator includes phase frequency detectors, each detecting the phase difference between two input signals (output signal and external reference signal) and outputting a control command signal for controlling the output signal to achieve a desired frequency on the basis of the phase difference. A plurality of ICs, each including a phase frequency detector, frequency dividers, a charge pump, and a lock detection circuit, is operated in parallel. A composite control command signal generated by combining outputs of the phase frequency detectors is output via a loop filter to a voltage-controlled oscillator. Whether phase noise is reduced sufficiently is determined on the basis of detection results by an amplitude detection circuit for detecting the amplitude of an AC component of the composite control command signal and the lock detection circuits. The phase frequency detectors are repeatedly reactivated until the phase noise is reduced sufficiently.

5 Claims, 17 Drawing Sheets

U.S. PATENT DOCUMENTS

| | | | |
|---|---|---|---|
| 6,411,143 B1 * | 6/2002 | Fernandez-Texon | 327/156 |
| 6,456,132 B1 | 9/2002 | Kouzuma | |
| 6,522,183 B2 | 2/2003 | Sumi | |
| 6,765,977 B1 * | 7/2004 | Adams et al. | 375/376 |
| 6,828,863 B2 * | 12/2004 | Itkin et al. | 331/2 |

FOREIGN PATENT DOCUMENTS

| | | |
|---|---|---|
| CN | 092131281 | 11/2003 |
| JP | 2-159822 | 12/1988 |
| JP | 5-243986 | 8/1992 |
| JP | 9-232949 | 2/1996 |
| JP | 10-215168 | 1/1997 |
| JP | 2000-082956 | 9/1998 |
| JP | 2000-106524 | 1/1999 |
| JP | 2001-036404 | 7/1999 |
| JP | 2001-144607 | 11/1999 |
| JP | 2001-339295 | 5/2000 |
| JP | 2002-111493 | 9/2000 |
| JP | 2003-124807 | 10/2001 |

* cited by examiner

OSCILLATOR INCLUDING PHASE FREQUENCY DETECTORS FOR DETECTING A PHASE DIFFERENCE BETWEEN TWO INPUT SIGNALS AND OUTPUTTING A CONTROL COMMAND SIGNAL

CROSS REFERENCE TO RELATED APPLICATIONS

This application is a Divisional application of U.S. application Ser. No. 10/702,635 filed Nov. 7, 2003 which issued as U.S. Pat. No. 7,061,330 on Jun. 13, 2006. Priority is claimed based on U.S. application Ser. No. 10/702,635 filed Nov. 7, 2003, which claims the priority date of Japanese Patent Application Nos. 2003-177427 and 2003-040891 filed Jun. 23, 2003 and Feb. 19, 2003, respectively, all of which are incorporated by reference.

BACKGROUND OF THE INVENTION

1. Field of the Invention

The present invention relates to oscillators for use in, for example, communication apparatuses for performing wired or wireless communication.

2. Description of the Related Art

There are known oscillators for use in, for example, communication apparatuses for performing wired or wireless communication.

Referring to FIG. 3, a specific example of such an oscillator will be described.

An oscillator B, which is an example of a known oscillator, has a known phase locked loop (PLL) configuration. The oscillator B is controlled by receiving, by a controller 150 included therein, a latch signal (LE), a data signal (DATA), and a clock signal (CLK), which are output from a micro processing unit (MPU) 100.

Specifically, the oscillator B includes a phase frequency detector (PFD) 130, a charge pump (CP) 140, a loop filter (LF) 300, and a voltage-controlled oscillator 400. The phase frequency detector 130 obtains a reference signal that is externally adjusted with high accuracy so as to serve as a reference for obtaining an output signal at a desired frequency from an RF output terminal 170 (hereinafter simply referred to as "REF") and an output signal that is actually output by the oscillator B (hereinafter simply referred to as "RF"), detects the phase difference between the obtained REF and RF, and, on the basis of the detection result, outputs a control command signal for controlling the output signal to achieve the desired frequency. The charge pump 140 processes, such as inverts or non-inverts, the control command signal output from the phase frequency detector 130 in accordance with the phase difference. The loop filter 300 smoothes the control command signal output from the charge pump 140. The voltage-controlled oscillator 400 generates RF (output signal) at the desired frequency on the basis of the smoothed control command signal generated by the loop filter 300.

The RF is output from the RF output terminal 170, and the REF is input from an REF input terminal 160.

The REF and RF are signals applied to the phase frequency detector 130. These two signals are divided in advance by a frequency divider 110 (for RF) and a frequency divider 120 (for REF) for dividing the corresponding signals by predetermined division ratios, respectively, prior to being input to the phase frequency detector 130. When the REF and RF have the same cycle, the frequency dividers 110 and 120 need not be provided.

Since the charge pump 140 converts the output signal of the phase frequency detector 130 into three modes, namely, a positive constant current output, a negative constant current output, and no output (off), in accordance with the phase difference between the input signals, the charge pump 140 may be omitted.

A frequency synthesizer IC is an example of an IC chip having the frequency dividers 110 and 120, the phase frequency detector 130, the charge pump 140, and the controller 150, which are packed in one integrated circuit.

The oscillator B arranged as described above obtains and generates these signals with, for example, timing shown in FIG. 4.

For example, the REF input from the REF input terminal 160 is divided by the frequency divider 120 (in this case, the division ratio R=2) to become FR1. At the same time, the RF output from the voltage-controlled oscillator 400 is divided by the frequency divider 110 (in this case, the division ratio R=8) to become FN1. The two signals (FR1 and FN1) now have the same cycle and are obtained by the phase frequency detector 130.

The phase frequency detector 130 detects the phase difference between the obtained two signals (FR1 and FN1) and outputs a control command signal based on the phase difference.

The charge pump 140 processes the output control command signal on the basis of the control command signal to generate a processed signal CP1. This processed signal CP1 is smoothed by the loop filter 300 and, on the basis of the smoothed signal, the voltage-controlled oscillator 400 outputs RF at the desired frequency.

The processing of the control command signal by the charge pump 140 will now be described.

For example, referring to FIG. 4, when the phase of the FR1 is ahead of the phase of the FN1, the charge pump 140 outputs the CP1 as a positive constant current pulse with a pulse width corresponding to the phase difference. On the other hand, referring to FIG. 5, when the phase of the FR1 is behind the phase of the FN1, the charge pump 140 outputs the CP1 as a negative constant current pulse with a pulse width corresponding to the phase difference. During a no-pulse period, the output of the charge pump 140 is opened.

The voltage-controlled oscillator 400 controls RF to achieve the desired frequency value in accordance with the polarity and the pulse width of the constant current pulse serving as the CP1.

In wired or wireless communication environment that has been developing greatly in recent years, advanced digital modulation schemes have been increasingly used at higher frequencies.

There is a demand for reducing, as much as possible, phase noise generated in the oscillator B, which is used to convert the frequency of a digitally-modulated signal at the time the digitally-modulated signal is demodulated.

It is known that the greater the division ratios of the frequency dividers 110 and 120, the greater the phase noise generated in the oscillator B.

A specific experiment was conducted in which the RF output frequency was 6 GHz, the division ratio N=200, and the processing frequency of the phase frequency detector 130 was 30 MHz. The result of this experiment shows that the floor level of phase noise is approximately −97 dB/Hz (the floor level designates a low frequency component of the phase noise, when viewed from the upper limit value of the RF output frequency, that is, the level of phase noise primarily generated from the frequency synthesizer IC).

In contrast, another experiment was conducted in which the RF output frequency was 6 GHz, the division ratio N=6000, and the processing frequency of the phase frequency detector 130 was 1 MHz. The result of this experiment shows that the floor level of phase noise is approximately −84 dB/Hz.

The results of the experiments show that, given the same RF value, the greater the division ratio, the greater the phase noise.

To reduce the phase noise, the division ratio of each frequency divider may be reduced. At present, the phase frequency detector 130 has an upper limit of approximately 56 MHz for the phase comparison frequency. When the phase frequency detector 130 handles high frequencies, as described above, the frequency dividers with large division ratios must be used. Suppression of phase noise is thus difficult to achieve.

Japanese Unexamined Patent Application Publication No. 2001-144607 describes a technique of selectively using a digital phase detector with a PLL having a wide locking range and an analog phase detector with low phase noise, depending on whether the PLL is unlocked or locked. According to this technique, a low-phase-noise signal can be generated under a wide locking range. However, this technique requires the high-accuracy phase detectors that can achieve target phase noise.

SUMMARY OF THE INVENTION

Accordingly, it is an object of the present invention to reduce phase noise without increasing the actual phase comparison frequency and without using high-accuracy components.

To achieve the foregoing object, according to a first aspect of the present invention, an oscillator is provided including a predetermined oscillation unit for outputting an output signal; and a plurality of phase frequency detectors. Each phase frequency detector detects the phase difference between two input signals, which are the output signal of the oscillation unit and an external reference signal, and outputs a control command signal for controlling the output signal to achieve a desired frequency on the basis of the phase difference. A composite control command signal generated by combining a plurality of control command signals output from the plurality of phase frequency detectors is output to the oscillation unit.

With this arrangement, according to experimental results, phase noise is reduced using not-so-high-accuracy, known-performance, and inexpensive phase frequency detectors.

According to a second aspect of the present invention, an oscillator is provided including a plurality of predetermined oscillation units for outputting a plurality of output signals; a plurality of phase frequency detectors, each phase frequency detector detecting the phase difference between two input signals, which are the output signal of the corresponding oscillation unit and an external reference signal, and outputting a control command signal for controlling the output signal to achieve a desired frequency on the basis of the phase difference; and a combining and outputting unit for combining the plurality of output signals from the plurality of oscillation units and outputting a composite signal.

With this arrangement of the oscillator having the same number of oscillation units as the phase frequency detectors, phase noise is reduced to the same degree as in the oscillator according to the first aspect of the present invention in which the composite control command signal is output to the single oscillation unit.

Parallel operation of the plurality of phase frequency detectors may cause variations in phase noise reduction. Due to the effect of phase jitter of a latch signal of an activation signal for setting the frequency and counter of each of the phase frequency detectors (signal for controlling the reading time at which each phase frequency detector reads a setting signal), the plural phase frequency detectors may be activated at slightly different times. In such a case, the plural phase frequency detectors operate having slightly different phases as their targets. As a result, the phase noise is not reduced sufficiently.

Even in such a case, reactivation (resetting) of the plural phase frequency detectors one or multiple times always results in a state where the phase noise is reduced sufficiently. In repeated reactivation, the reactivation signal has slight variations in the timing of reactivation. As a result, a state is achieved where there is minimal variation in the timing of reactivation of the plural phase frequency detectors.

Whether the phase noise is reduced sufficiently is determined on the basis of at least one of the amplitude of an AC component of the composite control command signal and a synchronization signal (so-called lock signal) of two input signals to each of the plural phase frequency detectors. The plural phase frequency detectors are reactivated repeatedly until the phase noise is reduced sufficiently.

Specifically, the oscillator according to the first aspect of the present invention may further include an amplitude detector for detecting whether the amplitude of an AC component of the composite control command signal is less than or equal to a predetermined level; and a first reactivation unit for reactivating the plurality of phase frequency detectors when it is determined by the amplitude detector that the amplitude is not less than or equal to the predetermined level.

The oscillator according to the first or second aspect of the present invention may further include a lock detector for detecting whether the two input signals are phase-locked to each other in each of the plurality of phase frequency detectors; and a second reactivation unit for reactivating the plurality of phase frequency detectors when it is determined by the lock detector that the two input signals are not phase-locked to each other in all or at least a predetermined number of the plurality of phase frequency detectors.

Accordingly, the phase noise is attenuated to a reduced level at all times.

The oscillator may further include filters arranged on individual power lines to the plurality of phase frequency detectors.

Parallel operation of the plurality of phase frequency detectors, as in the present invention, causes the levels (pulses) of output signals of the components to change almost simultaneously. When the components share the power supply, a large pulsed current flows simultaneously through the components, which in turn causes the power-supply voltage drop in a pulsed pattern. This voltage drop causes pulsed noise.

Such pulsed noise is prevented from occurring by the filters.

The oscillator may further include frequency dividers for all or some of the plurality of phase frequency detectors. The frequency dividers divide the output signal and the reference signal to be obtained by each of the phase frequency detectors by predetermined division ratios.

Using the frequency dividers with arbitrary combinations of division ratios for the output signal and the reference signal, the output frequency of the oscillation unit(s) can be easily adjusted to a desired target frequency.

In parallel operation of the plurality of phase frequency detectors, the output signal may include a large spurious component. The frequency-divided output signal including this spurious component may be locked to the frequency-divided reference signal, which is referred to as false locking. In such a case, the two input signals may be detected as being phase-locked to each other although such lock detection should not take place.

To avoid this problem, the oscillator may further include a division-ratio sequential setting unit for setting, prior to the lock detection by the lock detector, the division ratios of the frequency dividers corresponding to the output signal at a first preset frequency exceeding the upper limit frequency of an adjustable frequency range of the oscillation unit(s) and at a second preset frequency less than the lower limit frequency of the adjustable frequency range in a predetermined sequence and subsequently setting the division ratios of the frequency dividers corresponding to the output signal at the desired frequency.

Accordingly, the frequency of the output signal becomes the upper and lower limit frequencies of the oscillation unit(s) and then is adjusted to the desired target frequency. The problem of false locking is thus prevented.

DESCRIPTION OF THE PREFERRED EMBODIMENTS

With reference to the accompanying drawings, embodiments and modifications of the present invention will now be described. The embodiments and modifications described below serve only as examples embodying the present invention and are not intended to limit the technical scope of the present invention.

Figure 1:
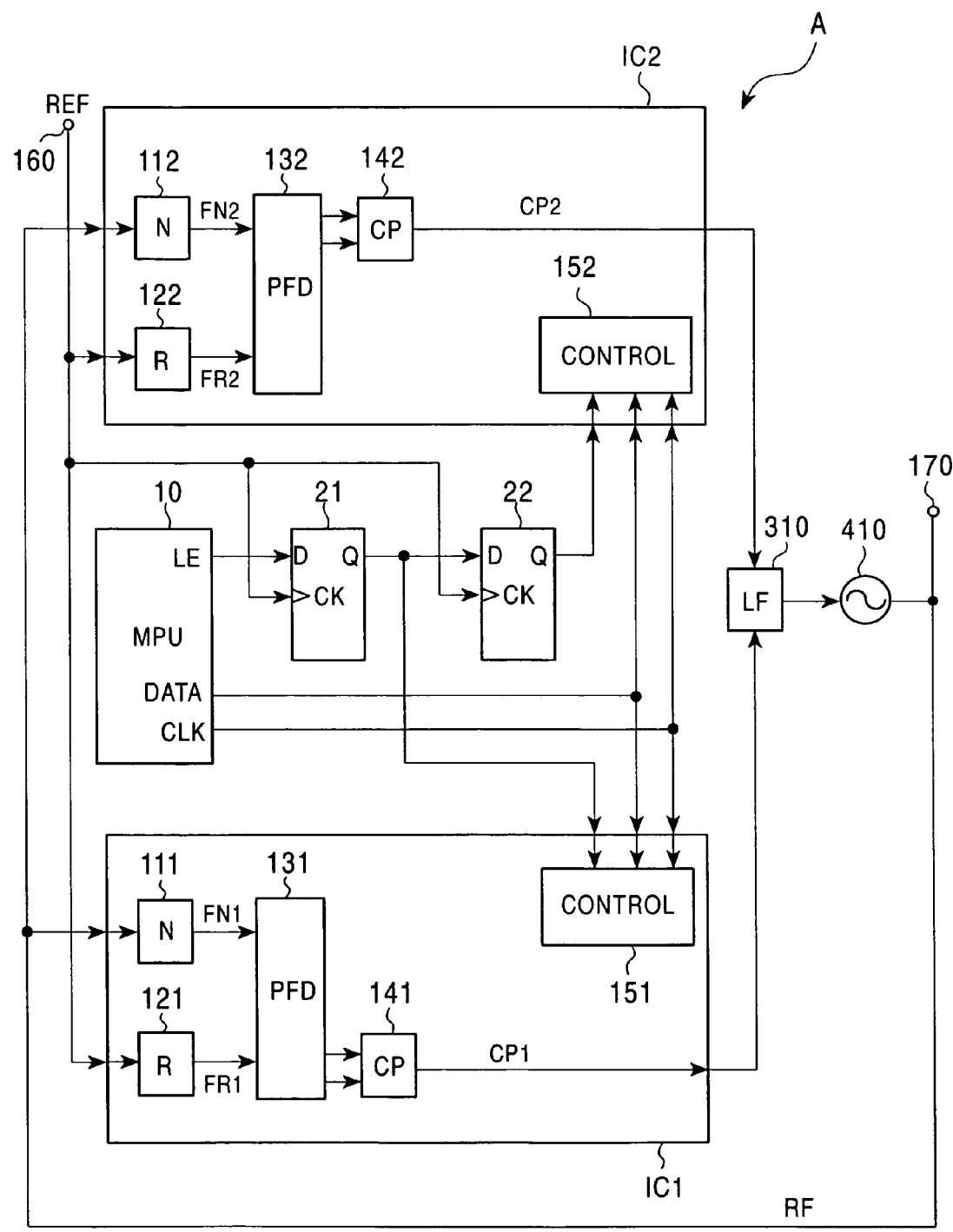
FIG. 1 is a schematic block diagram of an oscillator A according to a first embodiment of the present invention.

Referring to FIG. 1, the schematic configuration of an oscillator A according to a first embodiment of the present invention will now be described.

The oscillator A is largely divided into integrated circuits IC1 and IC2 having functions of phase frequency detectors and the like, a voltage-controlled oscillator 410 that constitutes a PLL by performing processes in conjunction with the IC1 and IC2 and generates RF (output signal), and an MPU 10 that controls the IC1 and IC2.

The schematic configuration of the IC1 will now be described.

The IC1 includes a phase frequency detector 131 and a charge pump 141. The phase frequency detector 131 receives (obtains) REF, which is externally adjusted with high accuracy so as to serve as a reference for obtaining an output signal at a desired frequency from an RF output terminal 170, and RF, which is actually output by the oscillator A. The phase frequency detector 131 detects the phase difference between the two input signals REF and RF (that is, frequency-divided signals FR and FN generated by frequency dividers 111 and 121 described later), and, on the basis of the detection result, outputs a control command signal for controlling the output signal to achieve the desired frequency. The charge pump 141 processes the control command signal output from the phase frequency detector 131 in accordance with the phase difference.

The IC1 includes the frequency dividers 111 (for RF) and 121 (for REF) for dividing the REF and RF received (obtained) by the phase frequency detector 131 by predetermined division ratios, respectively. These frequency dividers 111 and 121 divide the two corresponding signals REF and RF to generate two signals (FN1 and FR1; see FIG. 2) with the same cycle.

When the REF and RF have the same cycle, the frequency dividers 111 and 121 need not be provided.

The charge pump 141 outputs a positive or negative constant current pulse in accordance with the output signal of the phase frequency detector 131. The charge pump 141 may be omitted.

The IC2 includes the same components as those of the IC1. To distinguish the components of the IC2 from those of the IC1, the first digit of reference numeral denoting each component of the IC2 is changed to "2" (for example, the phase frequency detector of the IC1 is denoted by reference numeral 131, whereas the phase frequency detector of the IC2 is denoted by reference numeral 132).

The IC1 and IC2 arranged as described above are controlled by the MPU 10 for controlling the IC1 and IC2.

Specifically, the MPU 10 controls the IC1 and IC2 by transmitting a latch signal (LE), a data signal (DATA), and a clock signal (CLK) to controllers 151 and 152 included in the IC1 and IC2, respectively.

Particularly in the oscillator A, the latch signal is input to the controllers 151 and 152 of the IC1 and IC2, respectively, at different times using two D flip-flop circuits 21 and 22. Therefore, the IC1 and IC2 start operating at different times.

Figure 2:
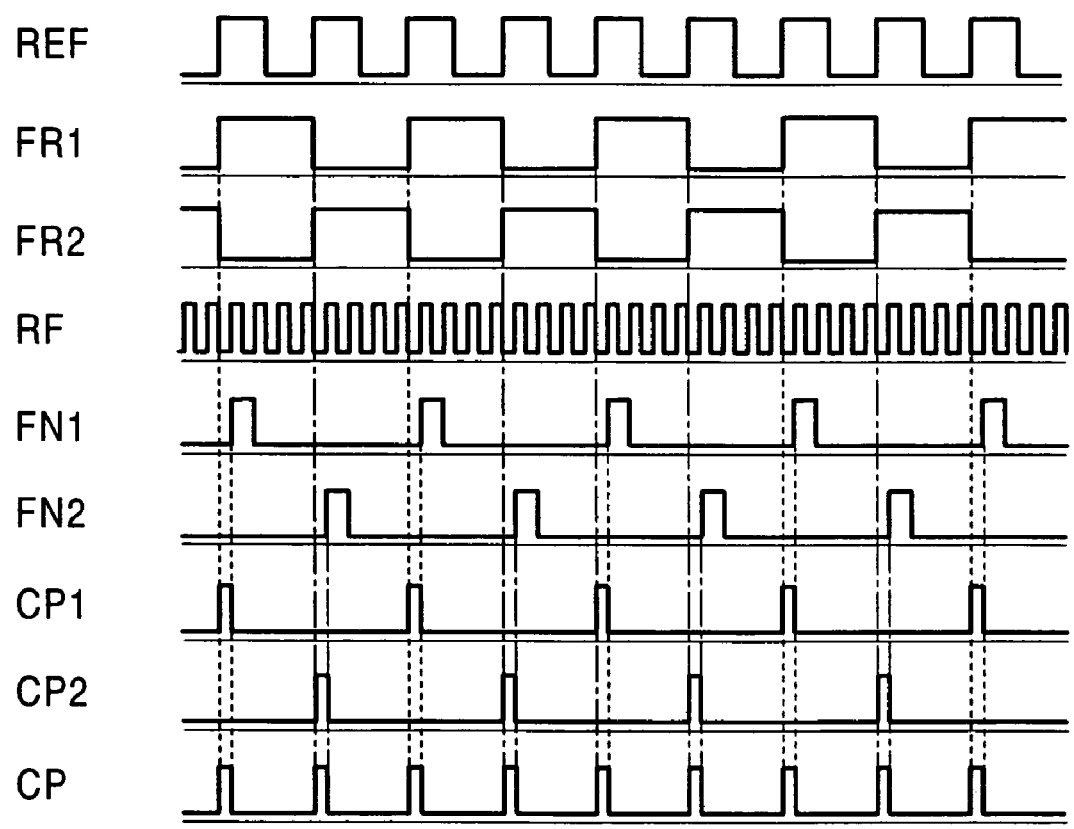
FIG. 2 is a timing chart of signal processing by the oscillator A.

Specifically, referring to FIG. 2, the frequency dividers 111 and 121 of the IC1 are set to have a leading phase, that is, the frequency dividers 111 and 121 start operating ahead of the frequency dividers 112 and 122 of the IC2, by one cycle of the waveform of the REF (for example, the rising of the FR1 has a leading phase relative to the rising of an FR2 by one cycle of the waveform of the REF).

The D flip-flop circuits 21 and 22 serve as an example of phase shifting means for shifting the phases of the RF and REF for each phase frequency detector (of each IC) by predetermined amounts.

With reference to FIGS. 1 and 2, the operation of the oscillator A arranged as described above will now be described.

When the oscillator A starts operating, the MPU 10 transmits a latch signal (LE). The transmitted LE is delayed by the two D flip-flop circuits 21 and 22, and the resultant delayed signals are input to the controllers 151 and 152 of the IC1 and IC2, respectively.

As has been described above, the operation start times of the IC1 and IC2 are shifted by the D flip flop circuits 21 and 22 so that the operation start times become out of phase by one cycle of the waveform of the REF. The IC1 starts operating, and then the IC2 starts operating.

The operation of the IC1 will now be described.

REF input from an REF input terminal 160 is divided by the frequency divider 121 (by the division ratio R=2 in this case) to generate FR1. At the same time, RF output from the voltage-controlled oscillator 410 is divided by the frequency divider 111 (by the division ratio N=8 in this case) to generate FN1. These two signals (FR1 and FN1) now have the same cycle and are input to the phase frequency detector 131.

The phase frequency detector 131 detects the phase difference between the two input signals (FR1 and FN1) and outputs a control command signal in accordance with the phase difference.

The charge pump 141 processes the output control command signal in accordance with the control command signal to generate a signal CP1. This signal CP1 is further smoothed by a loop filter 310.

The operation of the IC2 will now be described.

The IC2 operates in the same manner as that of the IC1. The IC2 starts operating after the operation start time of the IC1 by one cycle of the waveform of the REF.

REF input from the REF input terminal 160 is divided by the frequency divider 122 (by the division ratio R=2 in this case) to become FR2. At the same time, RF output from the voltage-controlled oscillator 410 is divided by the frequency divider 112 (by the division ratio N=8 in this case) to become FN2. These two signals (FR2 and FN2) now have the same cycle and are input to the phase frequency detector 132.

The phase frequency detector 132 detects the phase difference between the two input signals (FR2 and FN2) and outputs a control command signal in accordance with the phase difference.

The charge pump 142 processes the output control command signal in accordance with the control command signal to generate a signal CP2. This signal CP2 is further smoothed by the loop filter 310.

Upon reception of the CP1 and CP2 output from the IC1 and IC2, the loop filter 310 smoothes the signal waveforms of the CP1 and CP2 and combines the smoothed CP1 and CP2. The CP1 and CP2 will now be described.

FIG. 2 shows the times at which the CP1 and CP2 are input to the loop filter 310.

As is clear from FIG. 2, the CP1 and CP2 are alternately output from the IC1 and IC2, respectively, and input to the loop filter 310 every cycle of the waveform of the REF.

The times at which the CP1 and CP2 are output alternate every cycle of the waveform of the REF since, as described above, the operation start times of the IC1 and IC2 including the phase frequency detectors 131 and 132, respectively, are out of phase by one cycle of the waveform of the REF.

The loop filter 310 simply combines the out-of-phase CP1 and CP2 to generate a new signal CP and outputs the CP to the voltage-controlled oscillator 410 for outputting the RF in the end, thereby controlling the voltage-controlled oscillator 410.

Since the CP is generated by simply combining the CP1 and CP2 by the loop filter 310, the frequency of the CP is twice the frequency of the CP1 or CP2 (the frequency of the CP increases in proportion to the number of phase frequency detectors). It thus appears that the operation frequency of the phase frequency detectors of the oscillator A is doubled, when viewed from the entire oscillator A. In other words, the loop filter 310 serves as an example of control command combining means for combining control command signals output from the individual phase frequency detectors.

The oscillator A including the two phase frequency detectors with the same division ratios as those of a known oscillator B inputs the control signal CP, which is generated by phase comparison and which virtually has a frequency twice as high as that of the oscillator B, to the voltage-controlled oscillator 410.

Since the phase noise of each of the CP1 and CP2 is almost random, part of the phase noise is cancelled when the CP1 and CP2 are combined together. The phase noise of the composite control command signal increases not so much in proportion to the number of phase frequency detectors. Theoretically, the phase noise of the composite control command signal increases only approximately ($\sqrt{2}$) times. Compared with the oscillator B, the floor level of the phase noise of the oscillator A is reduced. Accordingly, the phase noise is reduced, that is, the signal-to-noise ratio is improved, using inexpensive phase frequency detectors of known performance or accuracy.

Modifications

In the above-described embodiment, a case in which the oscillator A outputs the control signal CP having a frequency twice that of the known oscillator B has been described. For example, an oscillator that has three D flip-flop circuits, three ICs with the same arrangement as that of the IC1, and an REF frequency divider with a division ratio of three outputs the control signal CP at a frequency three times that of the known oscillator B.

That is, the control signal CP at a frequency that is an integral multiple of that of the oscillator B can be output by an oscillator in which the number of D flip-flop circuits, the number of ICs, and the division ratio of the REF frequency divider are each an integral multiple of that of the oscillator B.

Although a case in which the voltage-controlled oscillator serves as RF output means has been described, a current-controlled oscillator may be used when the control signal output from the loop filter 310 is current.

In the above-described embodiment, a case has been described in which the phases of the RF and REF for each phase frequency detector (of each IC) have been shifted by predetermined amounts by the D flip-flop circuits 21 and 22. Alternatively, the phases of the RF and REF may be the same.

Figure 6:
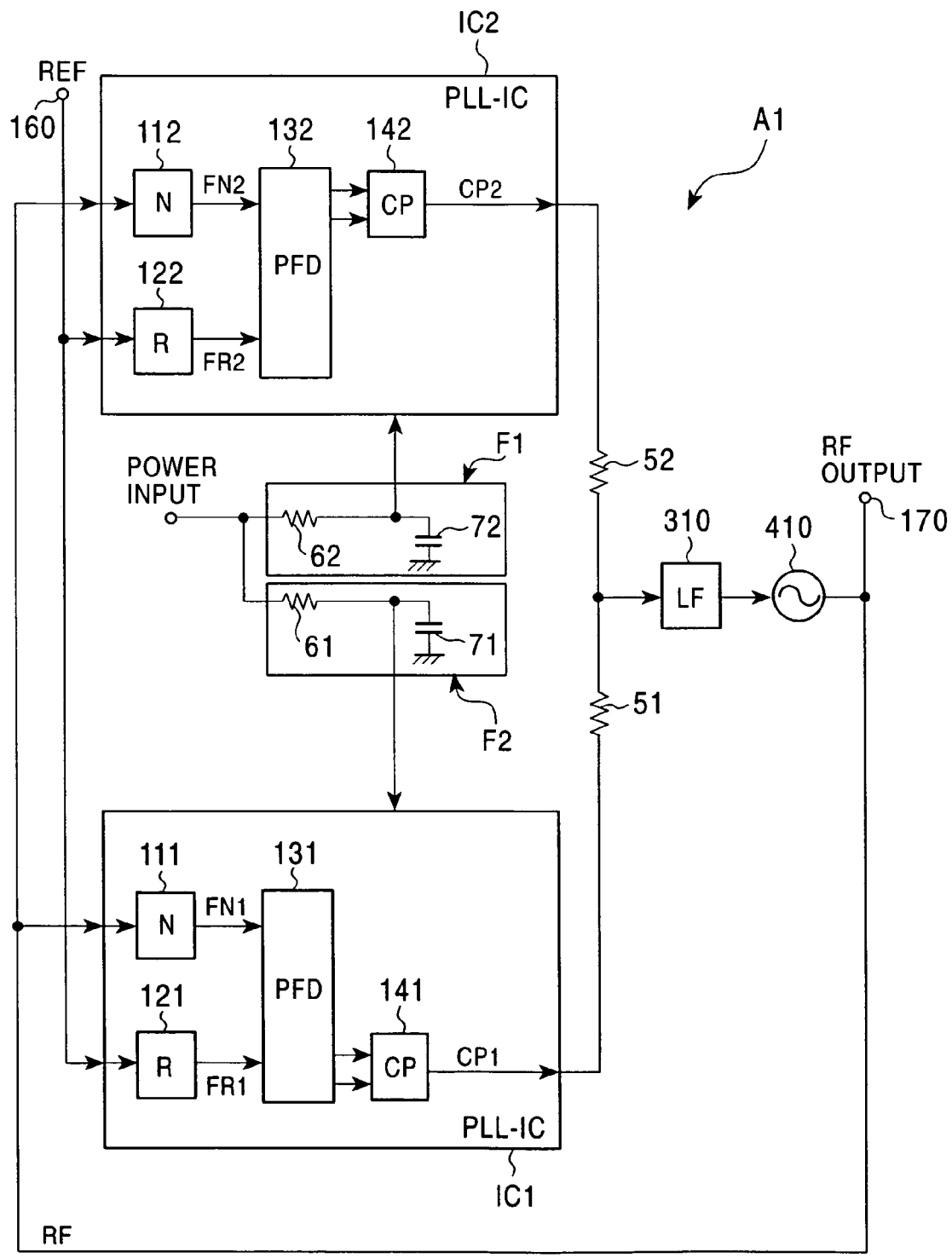
FIG. 6 is a schematic block diagram of an oscillator A1 according to a modification of the first embodiment of the present invention.

FIG. 6 shows the schematic configuration of an oscillator A1 according to a modification of the first embodiment of the present invention in which the phases are not shifted in each phase frequency detector (of each IC).

The oscillator A1 is similar to the oscillator A except that the MPU 10 and the two D flip-flop circuits 21 and 22 are removed from the oscillator A. As a result, the phases of the output signals of the IC1 and IC2 are only slightly shifted due to variations in characteristics of the IC1 and IC2.

To restrict current flow in the oscillator A1 when the output currents of the charge pumps 141 and 142 are opposite in polarity, resistors 51 and 52 are provided on signal paths from the IC1 and IC2, respectively, to the loop filter 310.

Filters F1 and F2 are provided on power lines to the IC1 and IC2 (that is, the phase frequency detectors 131 and 132), respectively.

Unlike the oscillator A described above, the phases of the output signals of the IC1 and IC2 are not shifted in the oscillator A1. Therefore, the levels (pulses) of the output signals of the components of the IC1 and IC2 change almost simultaneously. When the components share the power supply and are directly connected with one another, a large pulsed current flows simultaneously through the components, which in turn causes the power-supply voltage drop in a pulsed pattern. This voltage drop causes pulsed noise. Such pulsed noise is prevented from occurring by the filters F1 and F2.

FIG. 6 shows a case in which the filters F1 and F2 are RC low-pass filters including resistors 61 and 62 and capacitors 71 and 72, respectively. However, the filters F1 and F2 are not limited to such RC low-pass filters. For example, the filters F1 and F2 may be LC filters including coils and capacitors or active filters, such as three-terminal regulators.

Figure 7:
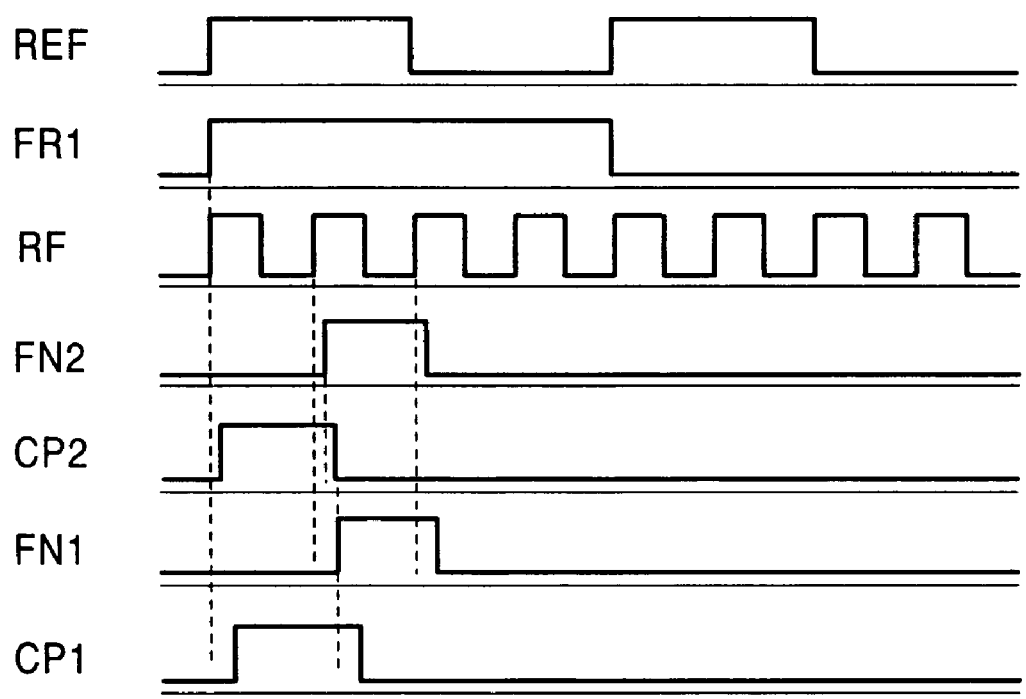
FIG. 7 is a timing chart of signal processing by the oscillator A1.

FIG. 7 is a timing chart of signal processing by the oscillator A1.

As shown in FIG. 7, the waveforms of the output signals CP1 and CP2 of the charge pumps 141 and 142 lag behind the true timing indicated by the dotted lines.

The IC is a digital circuit. Due to random noise of each semiconductor device used in the digital circuit or random noise or fluctuations of the power-supply voltage, the delay time of a signal passing through the digital circuit varies randomly within a predetermined range. Such fluctuations or variations in the delay time are referred to as jitter.

Jitter causes delays of the waveforms of the CP1 and CP2, which are shown in FIG. 7. These delays vary randomly. Since the IC1 and IC2 are independent circuits, there is almost no correlation between jitter affecting the CP1 and jitter affecting the CP2, and these jitters are individually random. A jitter component of the composite signal generated by the loop filter 310 is the power sum of jitter components of the output signals of the IC1 and IC2, respectively.

Since the same REF and RF are supplied to the IC1 and IC2, true phase comparison signal components (true output signals (excluding the jitter components) of the IC1 and IC2) are estimated as synchronized (phase-locked) signals. A true phase comparison signal component of the composite signal generated by the loop filter 310 is the current sum of the true phase comparison signal components of the CP1 and CP2.

Logarithmically, the jitter component Noise of the composite signal generated by the loop filter 310 increases in accordance with the number of ICs N as: Noise=10*log(N). If N=2, the jitter component Noise increases by 3 dB.

In contrast, the true phase comparison signal component Signal increases as: Signal=20*log(N). If N=2, the true phase comparison signal component Signal increases by 6 dB.

Therefore, the signal-to-noise ratio is improved by 3 dB, and the floor level of the phase noise is improved by 3 dB.

Parallel operation of the ICs (phase frequency detectors) enables reduction of phase noise without using high-accuracy components.

Although the IC1 and IC2 are operated in parallel with each other in the above-described modification, the present invention is not limited to this modification. The same advantages can be achieved by parallel operation of three or more ICs.

According to this idea, parallel operation of N ICs (phase frequency detectors) can improve the floor level of phase noise by 10*log(N).

With the arrangement shown in FIG. 6, an experiment was conducted where N=4 (four ICs were operated in parallel with one another). Whereas the floor level of phase noise of the known arrangement shown in FIG. 3 was −95 dBc/Hz, the floor level was improved to −101 dBc/Hz using the arrangement shown in FIG. 6. Specifically, the phase noise was reduced by an amount of 10*log(f)=6 dB. The parallel operation structure shown in FIG. 6 can be easily implemented by arranging a plurality of ICs on a printed circuit board or by arranging a plurality of IC chips in parallel with one anther in an IC package. In the latter case, since the size of chips is reduced as the IC technology advances, many more chips may be arranged in parallel with one another.

For example, parallel operation of 16 ICs is estimated to reduce the floor level of phase noise by 12 dB; 18 dB in the case of 64 ICs; and 24 dB in the case of 256 ICs.

FIGS. 10 to 13 are graphs showing examples of phase noise spectra (the results of analyzing the RF output) of oscillators. In each graph, the abscissa denotes a deviation from a predetermined carrier frequency (frequency offset), and the ordinate denotes the level of phase noise. Of four plots denoted by rhombic markers (numbered 1 to 4) in each graph, the plot with the marker number 1 (frequency offset=10 kHz) indicates the level of phase noise of the phase frequency detector (s) (131, 132, etc.). The plots with the marker numbers 2 to 4 indicate the levels of phase noise of the voltage-controlled oscillator 410.

Figure 3:
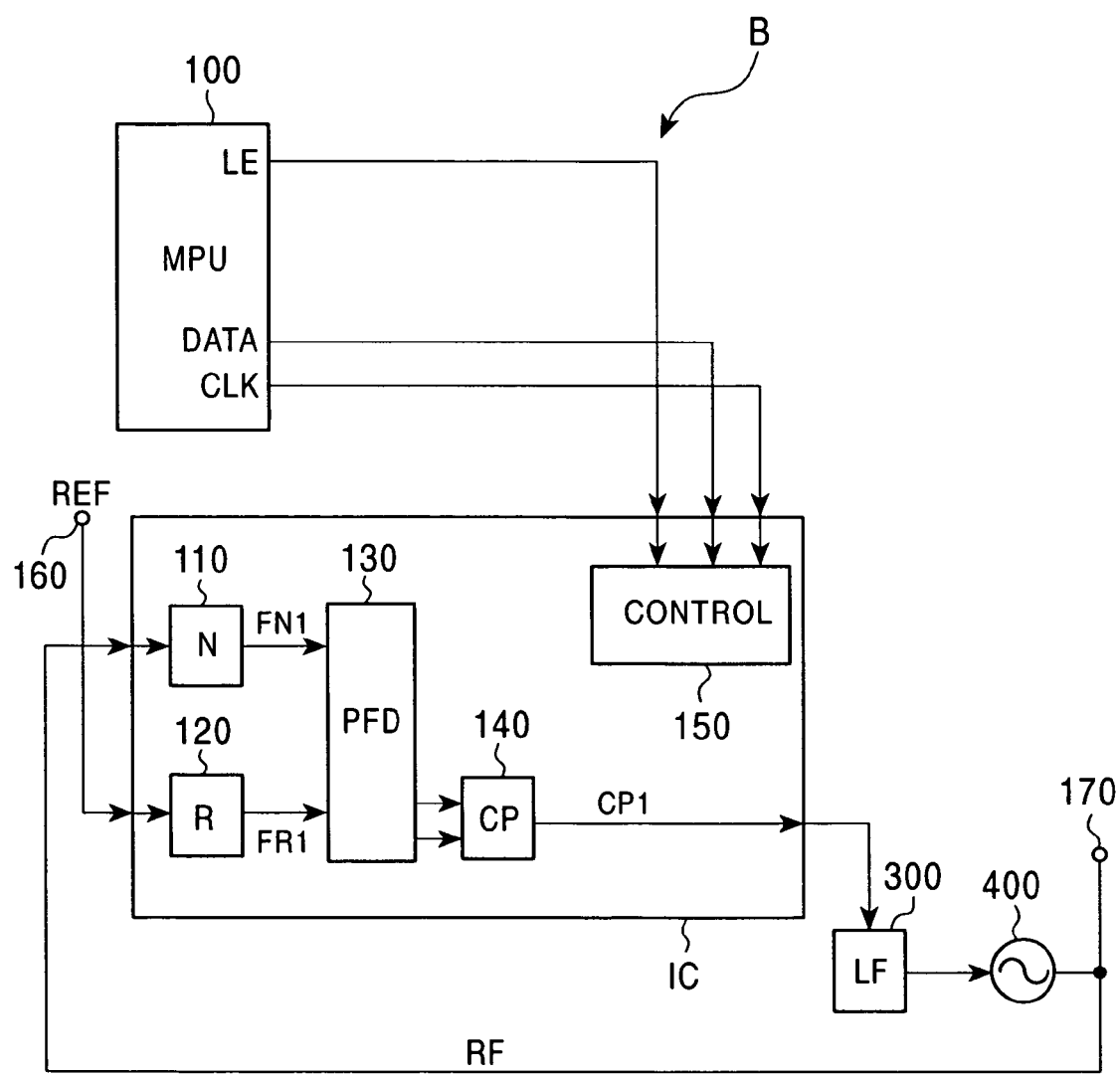
FIG. 3 is a schematic block diagram of a known oscillator B.
Figure 4:
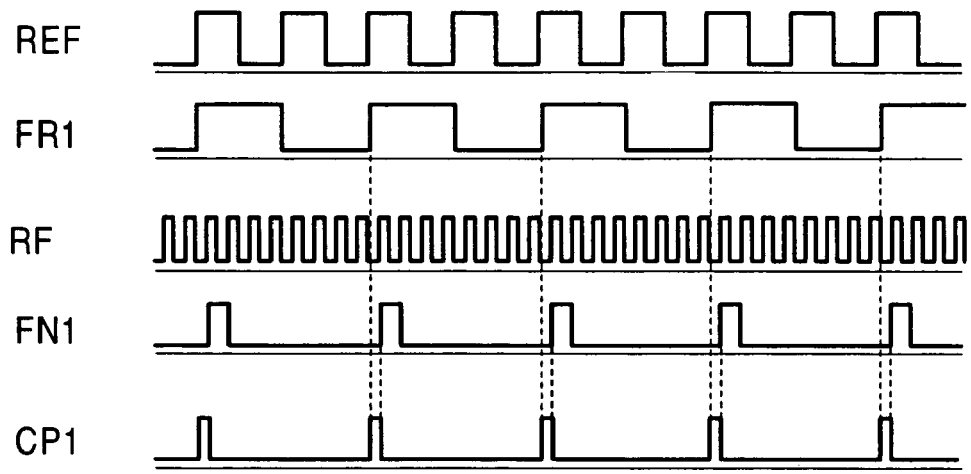
FIG. 4 is a timing chart of signal processing by the oscillator B.
Figure 5:
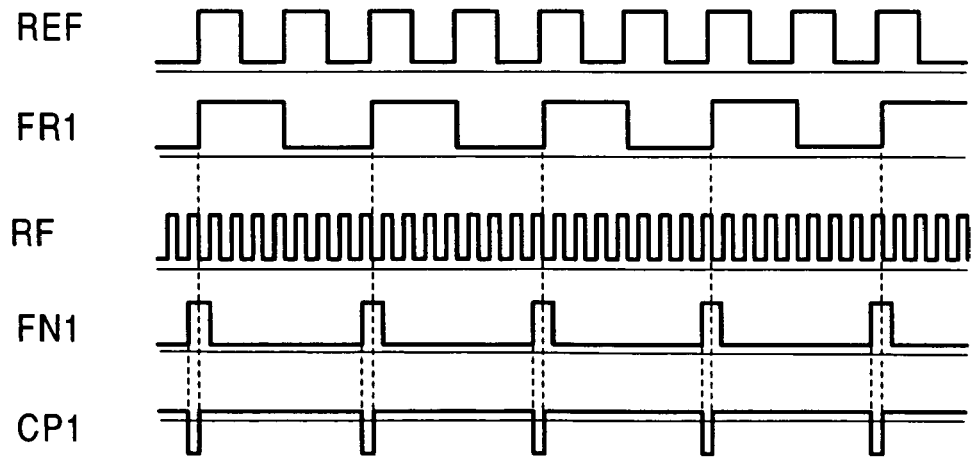
FIG. 5 is a timing chart of signal processing by the oscillator B.
Figure 10:
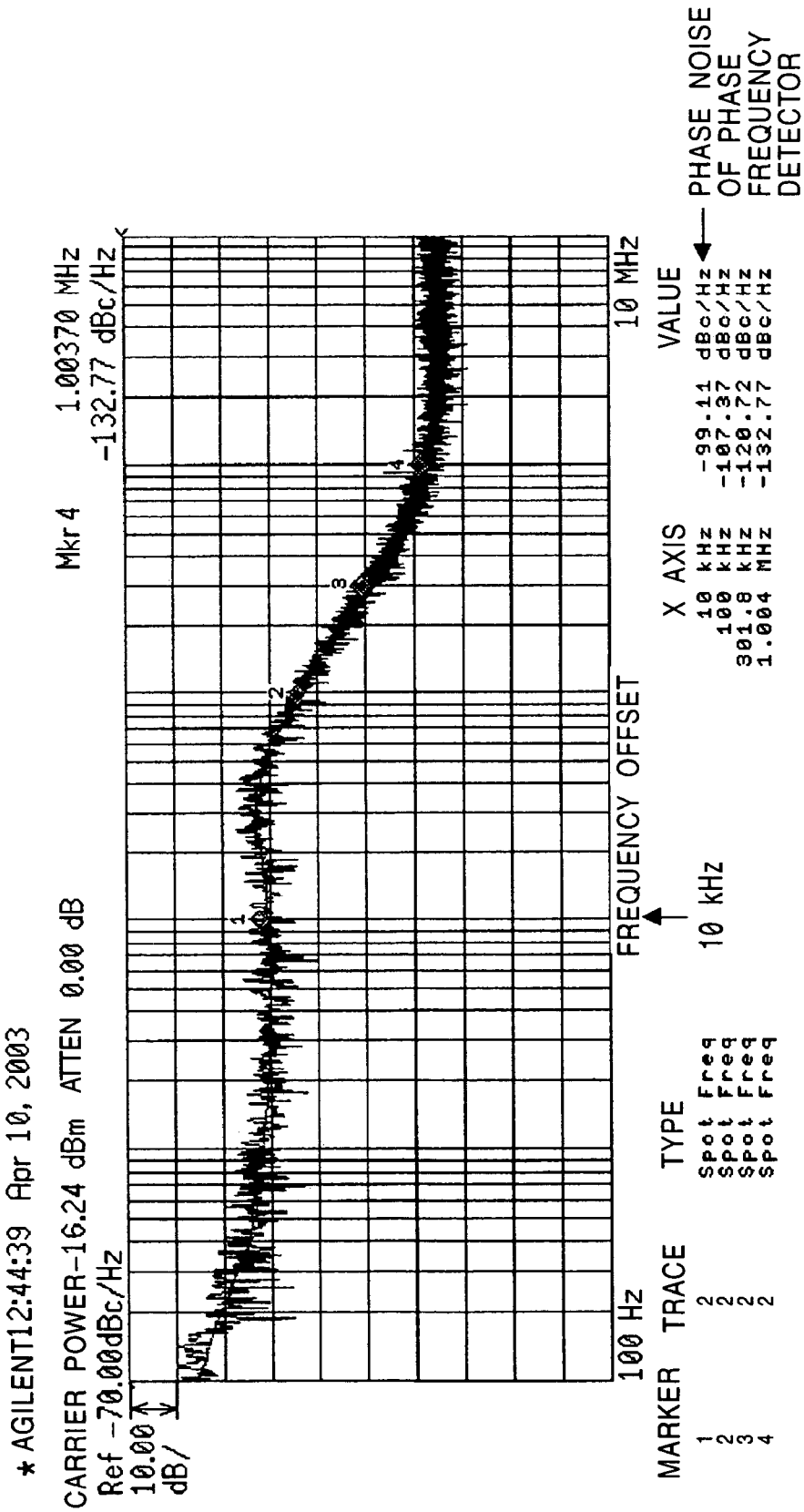
FIG. 10 is a graph showing the phase noise spectrum of the known oscillator B.
Figure 11:
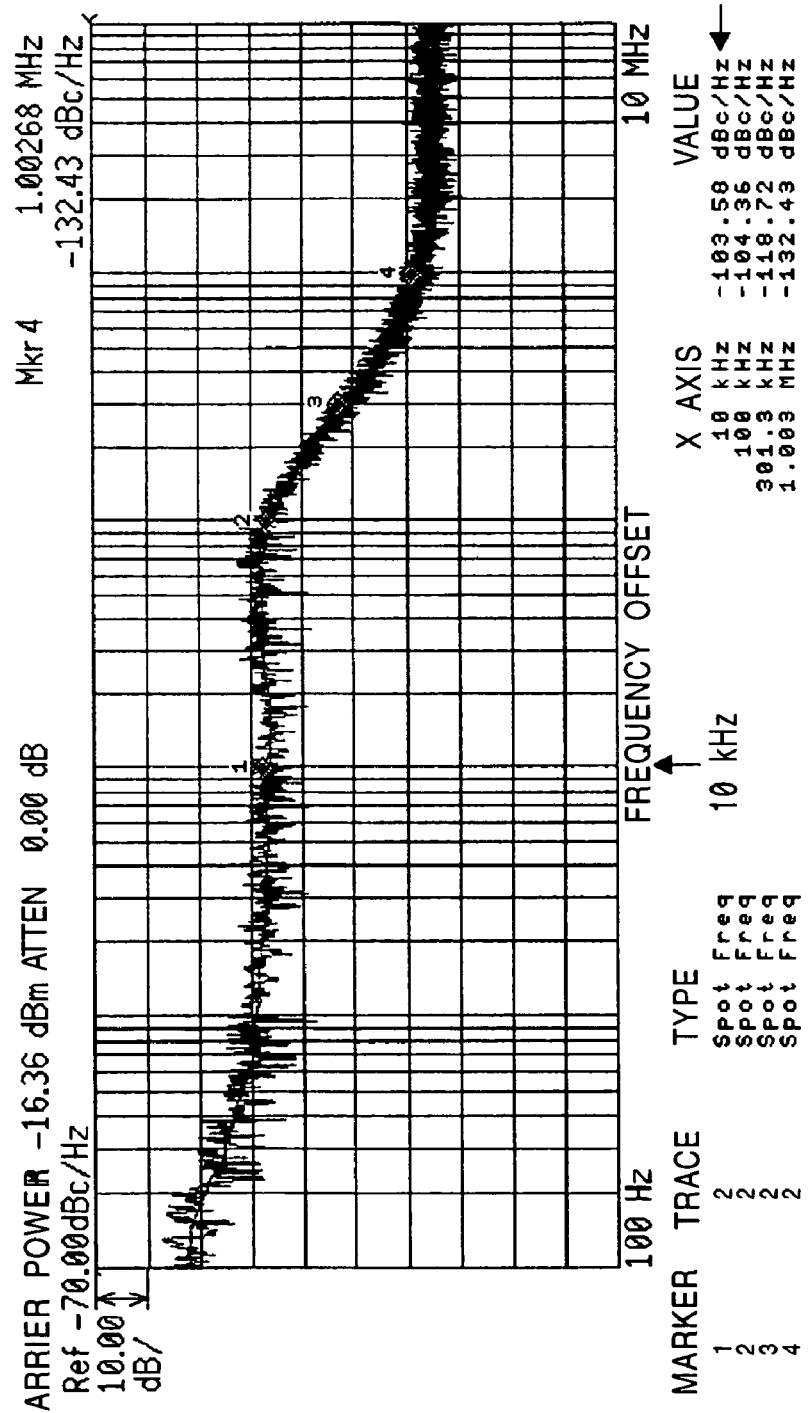
FIG. 11 is a graph showing the phase noise spectrum of an oscillator including two parallel-operated phase frequency detectors.
Figure 12:
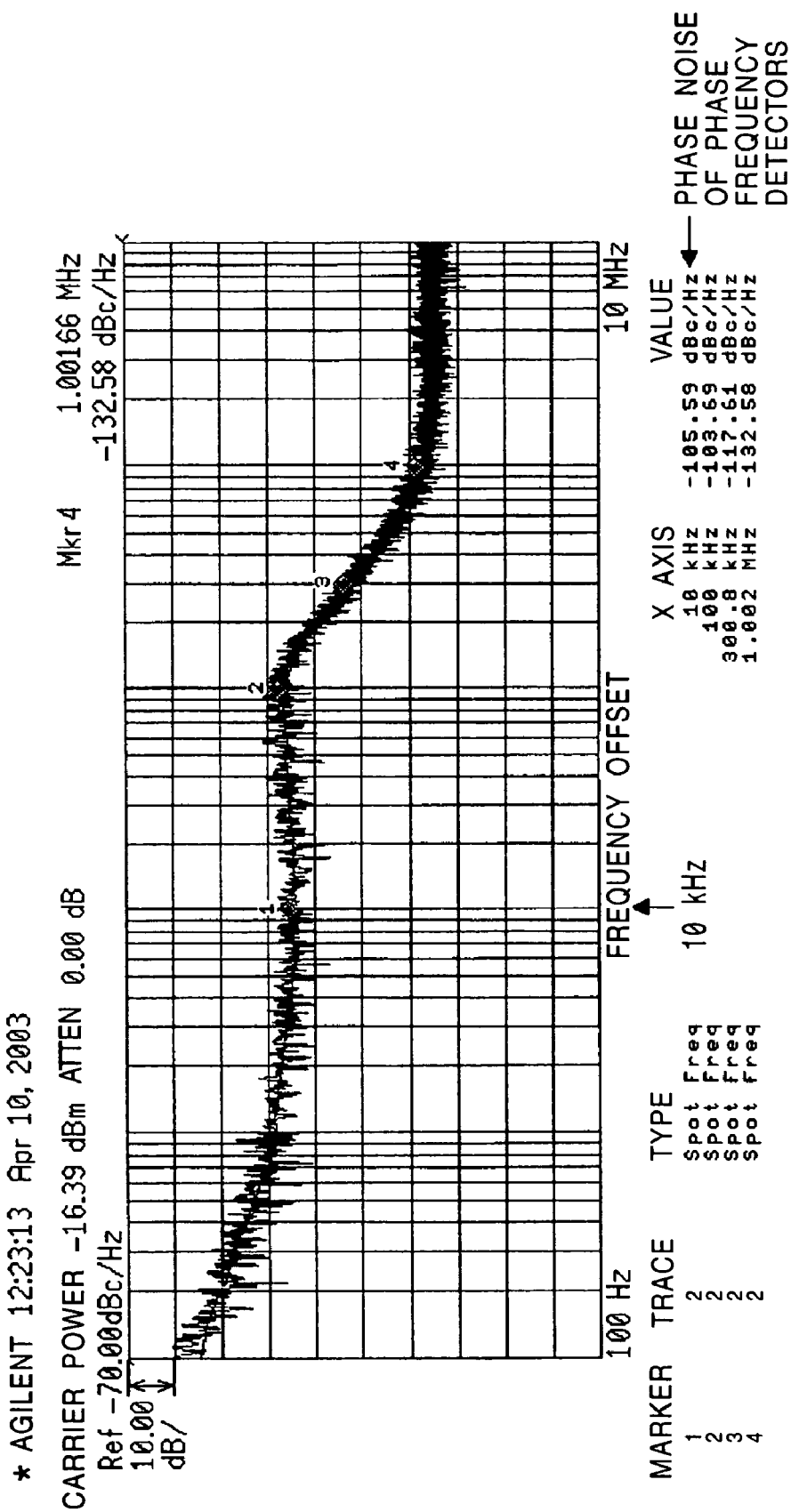
FIG. 12 is a graph showing the phase noise spectrum of an oscillator including three parallel-operated phase frequency detectors.
Figure 13:
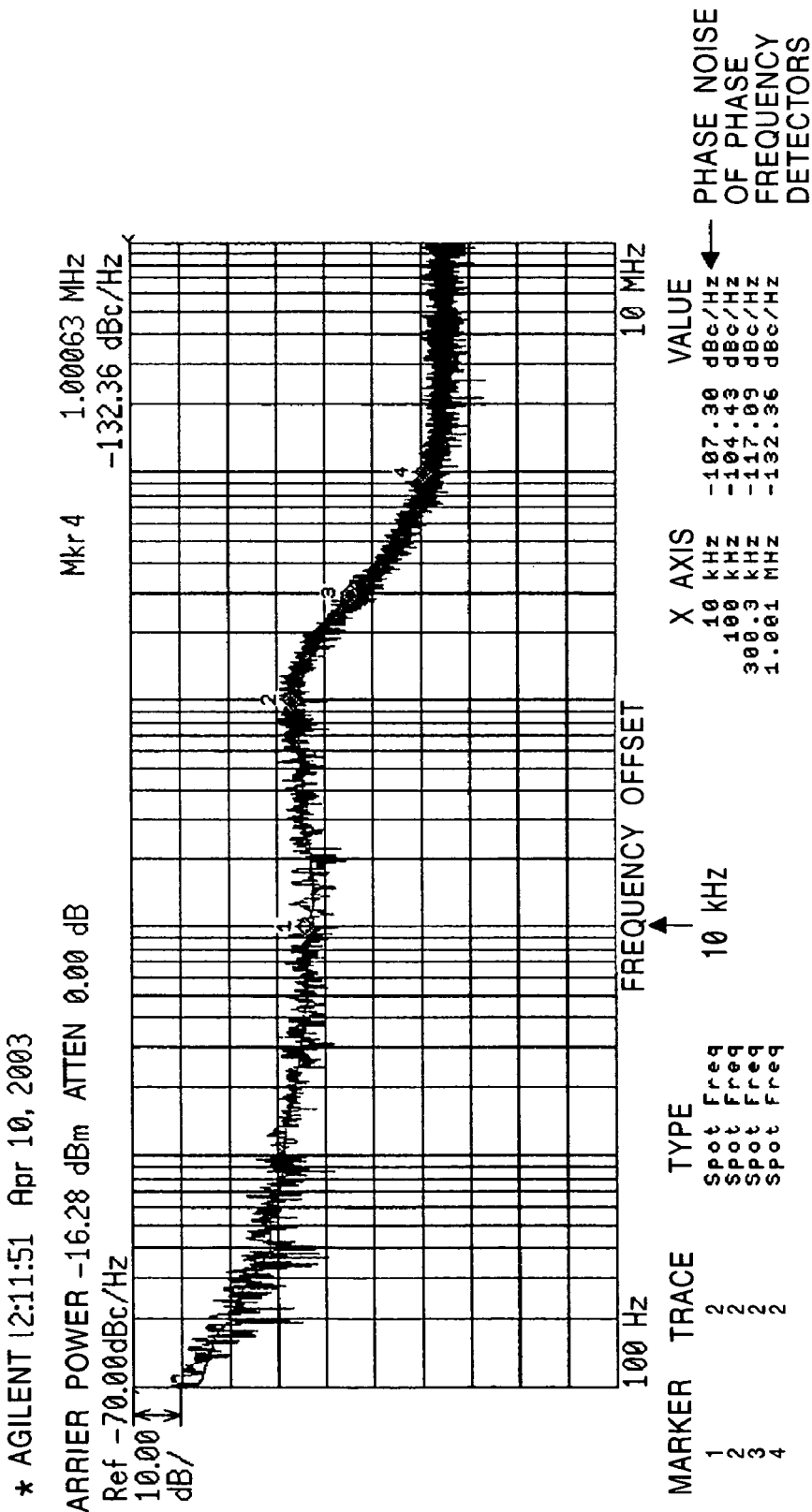
FIG. 13 is a graph showing the phase noise spectrum of an oscillator including four parallel-operated phase frequency detectors.

FIG. 10 is a graph showing an example of the phase noise spectrum of the known oscillator B (with one phase frequency detector) shown in FIG. 3; FIG. 11 is a graph showing an example of the phase noise spectrum of the oscillator A1 with two parallel-operated phase frequency detectors (see FIG. 6); FIG. 12 is a graph showing an example of the phase noise spectrum of an oscillator with three parallel-operated phase frequency detectors; and FIG. 13 is a graph showing an example of the phase noise spectrum of an oscillator with four parallel-operated phase frequency detectors.

According to the graphs shown in FIGS. 10 to 13, the known oscillator with one phase frequency detector has a phase noise level of the phase frequency detector of −99.11 dBc/Hz; the oscillator with two phase frequency detectors has a phase noise level of the phase frequency detectors of −103.58 dBc/Hz; the oscillator with three phase frequency detectors has a phase noise level of the phase frequency detectors of −105.59 dBc/Hz; and the oscillator with four phase frequency detectors has a phase noise level of the phase frequency detectors of −107.30 dBc/Hz. These results show that the greater the number of phase frequency detectors, the more the phase noise is reduced.

To prevent pulsed noise due to the pulsed power-supply voltage drop, the filter F1 and F2 are provided. In addition, the phases of the RF and REF input to each phase frequency detector (of each IC) may be shifted by very small amounts.

The width of pulsed noise may be very short duration ranging from pico-seconds to nano-seconds. When the signal paths to the IC1 and IC2 differ in length by approximately 1 to 100 mm, the pulse noises of the signal paths do not overlap each other, resulting in less interference. Therefore, there is no correlation between the noises, and phase noise is reduced.

As described above, parallel operation of a plurality of phase frequency detectors may cause variations in phase noise reductions.

Figure 14:
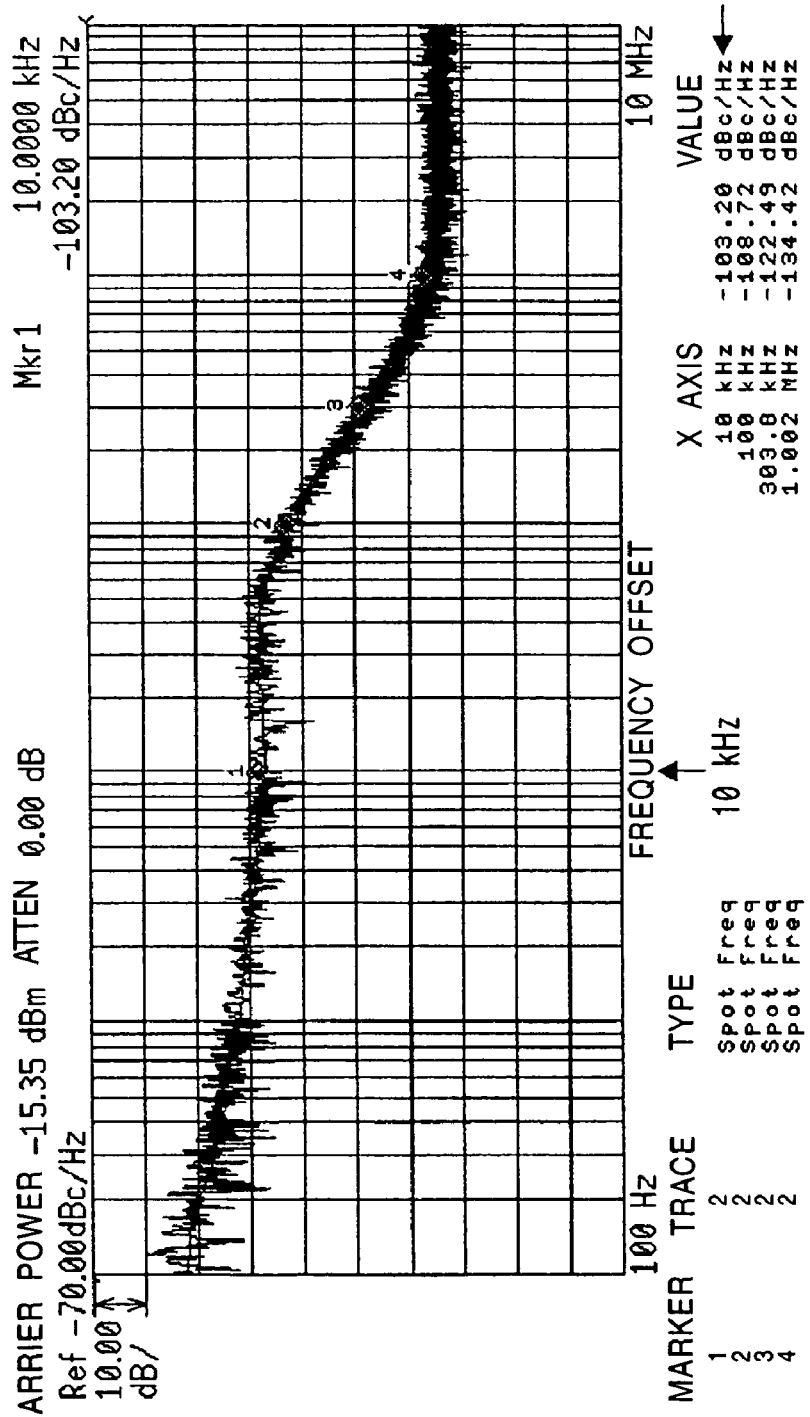
FIG. 14 is a graph showing the phase noise spectrum of the oscillator including the four parallel-operated phase frequency detectors in which reduction of the phase noise is insufficient.

FIG. 14 is, as in FIG. 13, a graph showing an example of the phase noise spectrum of the oscillator A1 having four parallel-operated phase frequency detectors in which phase noise reduction is poor.

Referring to FIGS. 13 and 14 showing a case in which four phase frequency detectors are operated in parallel with one another, the phase noise is improved (reduced) to −107.30 dBc/Hz when noise reduction is satisfactory (FIG. 13), whereas the phase noise is only improved to −103.20 dBc/Hz when noise reduction is poor (FIG. 14).

Due to the effect of the phase jitter of the latch signal of an activation signal for setting the frequency and counter of each of the IC1 and IC2 (signal for controlling the time at which each phase frequency detector reads a setting signal and reactivation), the plural phase frequency detectors may be activated at slightly different times. In such a case, the plural phase frequency detectors operate having slightly different phases as their targets. As a result, presumably, the phase noise is not reduced sufficiently.

Figure 8:
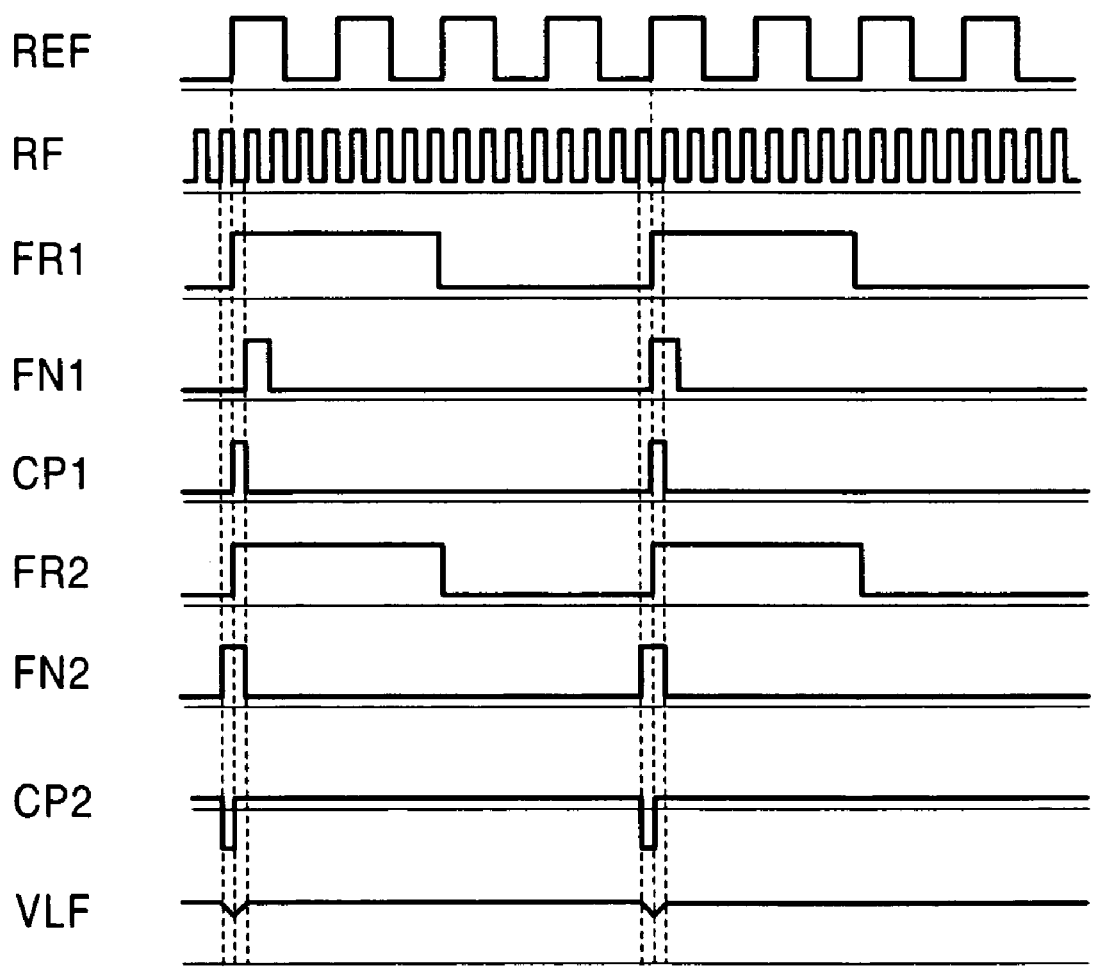
FIG. 8 is a timing chart of signal processing by the oscillator A1 when the phase difference between input signals is small.
Figure 9:
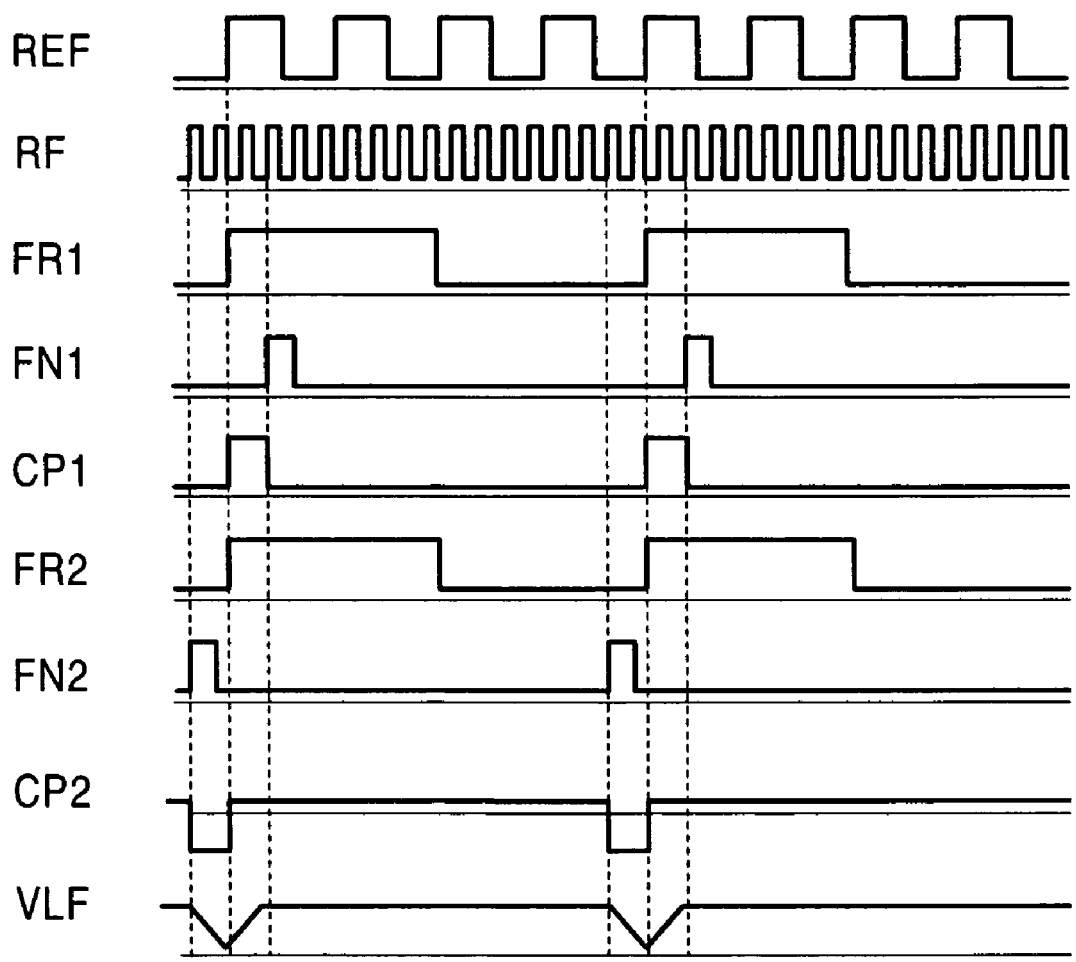
FIG. 9 is a timing chart of signal processing by the oscillator A1 when the phase difference between input signals is large.

FIGS. 8 and 9 are timing charts showing examples of signal processing by the oscillator A1 having the two parallel-operated phase frequency detectors 131 and 132, which is shown in FIG. 6. FIG. 8 shows a case in which the phase difference between frequency-divided RF signals (FN1 and FN2) input to the phase frequency detectors 131 and 132 is small; and FIG. 9 shows a case in which this phase difference is large. In FIGS. 8 and 9, although there is almost no phase difference between FR1 and FR2 (frequency-divided REF signals input to the phase frequency detectors 131 and 132), the phase difference between FR1 and FN1 input to the phase frequency detector 131 is opposite in direction from the phase difference between FR2 and FN2 input to the phase frequency detector 132.

A comparison of composite control command signals VLFs (output signals of the loop filter 310) in FIGS. 8 and 9 shows that the greater the phase difference between FN1 and FN2 (the phase difference between the signals input to the phase frequency detectors), the greater the amplitude of an AC component (recessed portion) of the composite control command signal VLF. In such a state, the phase noise of the RF signal is not reduced sufficiently.

Even when such a state shown in FIG. 14 or 9 occurs, reactivation (resetting) of the plural phase frequency detectors one or multiple times always results in a satisfactory state where the phase noise is reduced sufficiently, as shown in FIG. 13 or 8. In repeated reactivation, the reactivation signal has slight variations in the timing of reactivation. As a result, a state is achieved where there is minimal variation in the timing of reactivation of the plural phase frequency detectors.

Figure 15:
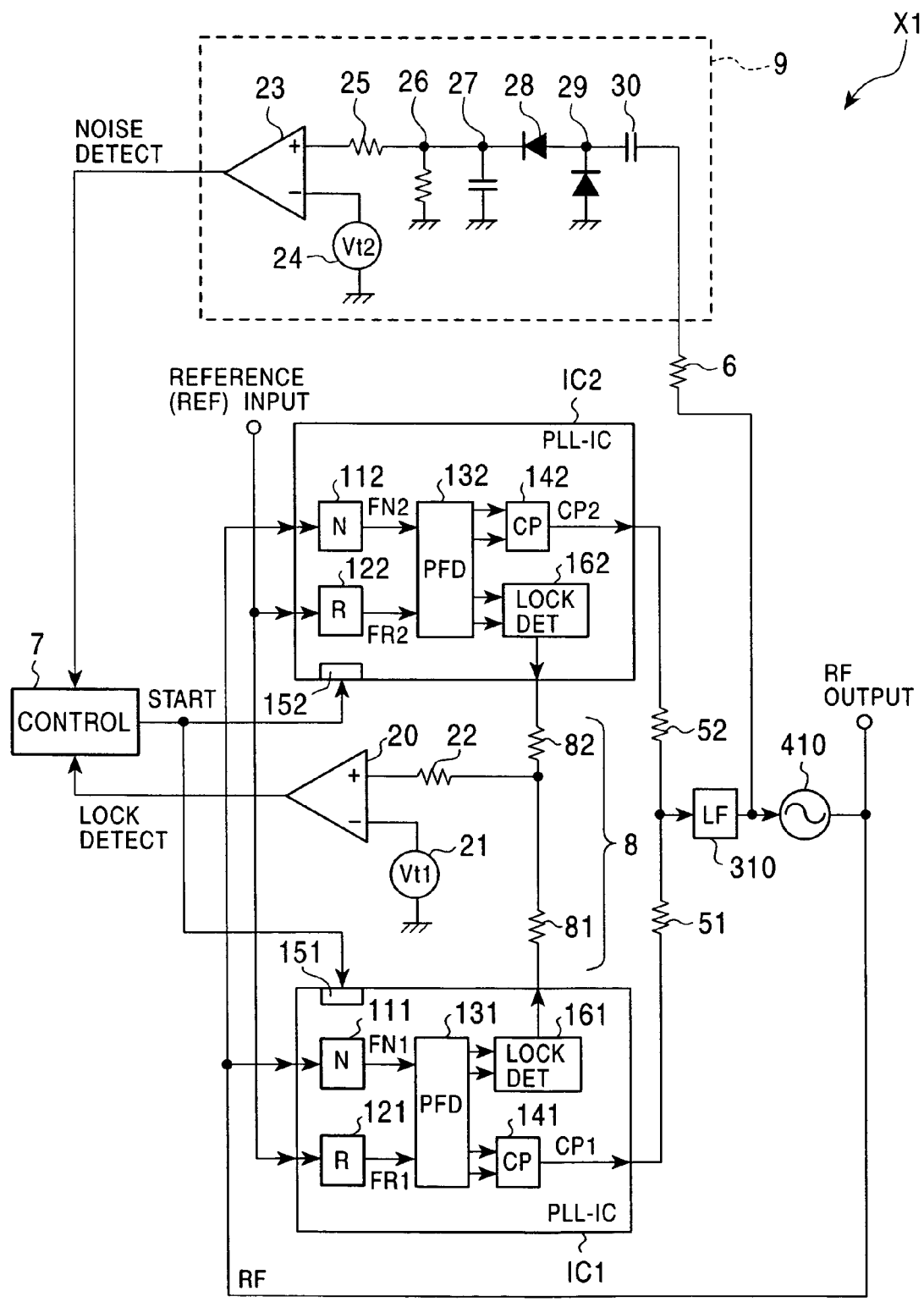
FIG. 15 is a schematic block diagram of an oscillator X1 according to a modification of the first embodiment of the present invention.

FIG. 15 is a block diagram showing the schematic configuration of an oscillator X1 according to a modification of the first embodiment of the present invention. In the oscillator X1, whether the phase noise is reduced sufficiently is determined on the basis of the amplitude of an AC component of the composite control command signal generated by combining the output signals (control command signals) of the plural phase frequency detectors and a synchronization signal (so-called lock on signal) of two input signals (FN1 and FR1 or FN2 and FR2; hereinafter simply referred to as FN and FR) to each of the plural phase frequency detectors, and the plural phase frequency detectors are reactivated repeatedly until the phase noise is reduced sufficiently.

The oscillator X1 is similar to the above-described oscillator A1 (FIG. 6) in that two integrated circuits IC1 and IC2 and connected in parallel; the output signals of the IC1 and IC2 are combined via the resistors 51 and 52, respectively, by the loop filter 310; and this composite control command signal VLF is output to the voltage-controlled oscillator 410. The voltage-controlled oscillator 410 serves as an example of oscillation means.

The oscillator X1 differs from the oscillator A1 in that the oscillator X1 is provided with lock detection circuits 161 and 162 (serving as an example of lock detection means) for determining whether two input signals (FN and FR) are phase-locked to each other in each of the phase frequency detectors 131 and 132; an amplitude detection circuit 9 (serving as an example of amplitude detection means) for determining whether the amplitude of the AC component of the composite control command signal VLF is less than or equal to a predetermined level; and an activation control circuit 7 (serving as an example of first and second reactivation means) for outputting a frequency setting signal and a reset signal to the IC1 and IC2 (that is, reactivation signal to the phase frequency detectors 131 and 132) on the basis of the detection results by the lock detection circuits 161 and 162 and the amplitude detection circuit 9. The oscillator X1 further includes an all-lock-on detection circuit 8 arranged between the lock detection circuits 161 and 162 and the activation control circuit 7. The all-lock-on detection circuit 8 outputs an ON signal (hereinafter referred to as an all-lock-on signal) to the activation control circuit 7 only when all (both) of the lock detection circuits 161 and 162 output lock-on signals indicating that the two input signals (FN and FR) are phase-locked.

The lock detection circuits 161 and 162 are included in a general frequency synthesizer IC. The detection method differs depending on each IC. For example, when the phase difference between the two input signals FN and FR becomes less than or equal to a predetermined phase difference time (for example, 15 ns) or a predetermined phase angle for predetermined consecutive cycles (for example, five consecutive cycles), it is determined that the input signals FN and FR are phase-locked, and the lock-on signal is output. Otherwise, no lock-on signal is output.

The all-lock-on detection circuit 8 includes a comparator 20 that receives a composite signal generated by combining output signals of the lock detection circuits 161 and 162 via resistive elements 81, 82, and 22 and an output signal of a Threshold voltage source 21. Accordingly, only when the lock-on signals of all (both) of the lock detection circuits 161 and 162 are ON, the level of the composite signal exceeds the output level of the Threshold voltage source 18, and the output of the comparator becomes ON.

When any of the lock detection circuits 161 and 162 outputs no lock-on signal, the following may be possible. For example, when the phase frequency detectors 131 and 132 have phase differences (phase differences between two input FNs and FRs, respectively) in opposite directions, the phase frequency detectors 131 and 132 may adjust the phase differences in directions contrary to these directions, resulting in convergence failure in which the signals are not locked on. In such a state, the phase noise of the RF output is not reduced sufficiently.

When the number of parallel-operated phase frequency detectors is relatively small (for example, up to a few phase frequency detectors), one phase frequency detector in which the input signals are not phase-locked has a great effect on the phase noise of the RF output. It is thus preferable that the plural phase frequency detectors be reactivated (reset) repeatedly until all the phase frequency detectors are in a locked-on state.

When there are many phase frequency detectors, the degree of influence on phase noise per phase frequency detector is smaller. Not all phase frequency detectors need to be in the locked-on state. The phase noise can be reduced sufficiently by repeated reactivation of the phase frequency detectors until at least a predetermined number of phase frequency detectors enter the locked-on state.

At the same time, the amplitude detection circuit 9 includes resistive elements 25 and 26, capacitive elements (capacitors) 27 and 30, diodes 28 and 29, and a comparator 23, all of which constitute a circuit for detecting the amplitude level of an AC component of the composite control command signal VLF (the depth of a recessed portion of VLF in FIGS. 8 and 9). The comparator 23 receives a signal indicating the extracted AC amplitude level and an output signal of a Threshold voltage source 24. Accordingly, the output of the comparator 23 becomes ON only when the signal indicating the amplitude level of the AC component of the composite control command signal VLF exceeds the output level of the Threshold voltage source 24.

The output level of the Threshold voltage source 24 may be set to a slightly higher level than the output level of the amplitude detection circuit 9 achieving the most satisfactory phase noise of the RF output, depending on the number of parallel-operated phase frequency detectors.

Using a flowchart of FIG. 16, the steps of a process of activating and reactivating the IC1 and IC2 by the activation control circuit 7 when power is applied to the oscillator X1 will now be described. Reference numerals S1, S2 . . . denote the numbers assigned to the steps of the process.

When power is turned on, the activation control circuit 7 waits for a predetermined period of time (such as 100 ms) (S1). Subsequently, the activation control circuit 7 performs a predetermined activation process on the IC1 and IC2 (S2). In this activation process, the activation control circuit 7 sequentially performs a frequency setting process (S21) of setting an RF-output target frequency (desired frequency) to the IC1 and IC2 and a counter resetting process (S22) of outputting a reset signal (latch signal) for activating the IC1 and IC2 (reactivating (resetting) when the IC1 and IC2 are activated). When the target frequency is set, division ratios based on the target frequency are set to the frequency dividers 111, 121, 112, and 122 in the IC1 and IC2.

After the activation control circuit 7 waits for a predetermined period of time (such as 100 ms) (S3), the activation control circuit 7 checks the output signals of the all-lock-on detection signal 8 and the amplitude detection circuit 9 (S4 and S5) and, when at least one of the two circuits 8 and 9 outputs no ON signal (at least one remains OFF), the activation control circuit 7 returns to step S2 and performs the activation process (that is, the reactivation process) on each of the IC1 and IC2. Accordingly, the phase frequency detectors 131 and 132 are reactivated. The processing from steps S2 to S5 is repeated until the ON signals from both of the circuits 8 and 9 are detected within a predetermined period of time (100 ms) after the activation (or resetting)

Normally, the resetting of the IC1 and IC2 several to several dozens of times causes the two circuits 8 and 9 to output ON signals. These ON signals are detected, and the oscillator X1 enters the steady operation state. In steady operation, whether the ON signals from the two circuits 8 and 9 are switched to OFF signals is checked (S4 and S5). When an OFF signal is detected, the reset process (S2) is again performed.

When the oscillator X1 enters the steady operation state after the above-described reset process is performed, the phase noise of the output signals of the phase frequency detectors 131 and 132 is reduced sufficiently, as shown in FIG. 13. As a result, the phase noise of the RF output (output of the voltage-controlled oscillator 410) is reduced sufficiently.

Figure 16:
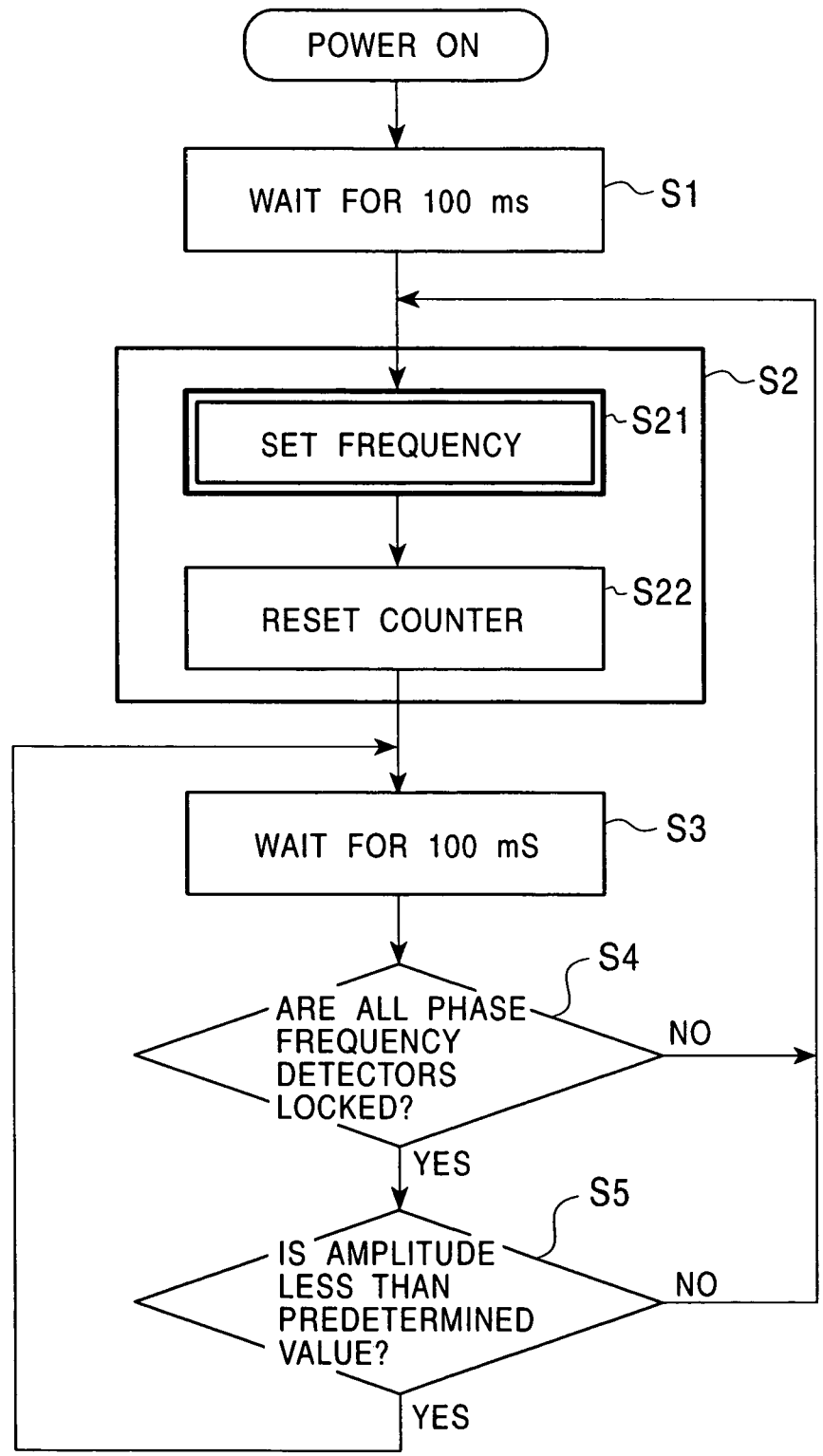
FIG. 16 is a flowchart showing a process of activating and re-activating phase frequency detectors of the oscillator X1.

Although not shown in FIG. 16, when no ON signals from the two circuits 8 and 9 are detected even when the reset process (S2) is repeated a predetermined maximum number of times, a predetermined error process may be performed.

Using a flowchart of FIG. 17, the details of the frequency setting process (S21) by the activation control circuit 7 will be described.

In the frequency setting process (S21), the activation control circuit 7 sets the preset frequency of each of the IC1 and IC2 to a first preset frequency exceeding the upper limit frequency of an adjustable frequency range of the voltage-controlled oscillator 410 (that is, exceeding the frequency range) (S31). Division ratios based on the preset frequency are set by the controllers 151 and 152 to the frequency dividers 111, 121, 112, and 122 (and so forth).

After the activation control circuit 7 waits for a predetermined period of time (such as 1 ms) (S32), the activation control circuit 7 sets the preset frequency of each of the IC1 and IC2 to a second preset frequency less than the lower limit frequency of the adjustable frequency range of the voltage-controlled oscillator 410 (that is, less than the frequency range) (S33).

After the activation control circuit 7 waits for a predetermined period of time (such as 1 ms) (S34), the activation control circuit 7 again sets the preset frequency of each of the IC1 and IC2 to the first preset frequency (S35)

After the activation control circuit 7 waits for a predetermined period of time (such as 1 ms) (S36), the activation control circuit 7 sets the preset frequency of each of the IC1 and IC2 to a target frequency (desired frequency) of the RF output signal (S37). Subsequently, the activation control circuit 7 waits for a predetermined period of time (such as 1 ms), and the frequency setting process is terminated. For example, when the voltage-controlled oscillator 410 has an adjustable frequency range of 5990 to 6010 MHz, the first preset frequency is set to 6025 MHz, the second preset frequency is set to 5975 MHz, and the predetermined target frequency of the adjustable frequency range is set to, for example, 6000 MHz. The processing in steps S31 to S38 serves as an example of a process performed by division-ratio sequential setting means.

By executing the above-described frequency setting process (division-ratio sequential setting process) prior to the locking-on detection by the all-lock-on detection circuit 8 (S4 of FIG. 16), the frequency of the RF output signal becomes the upper and lower limit frequencies of the voltage-controlled oscillator 410 and then is adjusted to the target frequency. Therefore, the problem of false locking is prevented.

Figure 17:
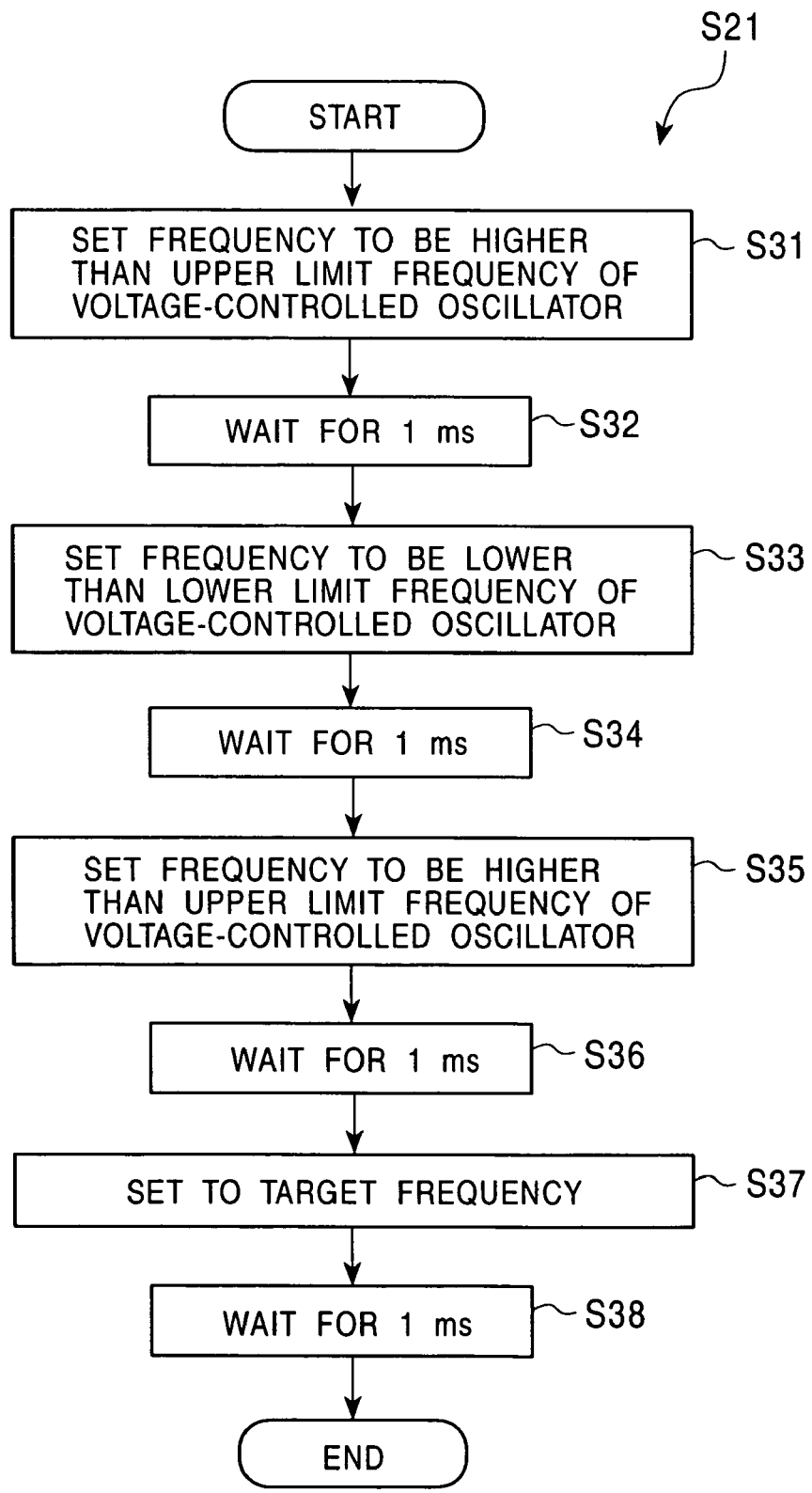
FIG. 17 is a flowchart showing a process of setting the frequency of the oscillator X1.

Although the frequencies of the IC1 and IC2 are first set to the first preset frequency (preset frequency exceeding the upper limit frequency) in the example shown in FIG. 17, the present invention is not limited to this example. Alternatively, the frequencies of the IC1 and IC2 may be set to the second frequency in the first place.

Although the frequencies of the IC1 and CI2 are set to the first preset frequency twice (S31 and S35) in the example shown in FIG. 17, the second time (S35 and S36) may be omitted.

Second Embodiment

Figure 18:
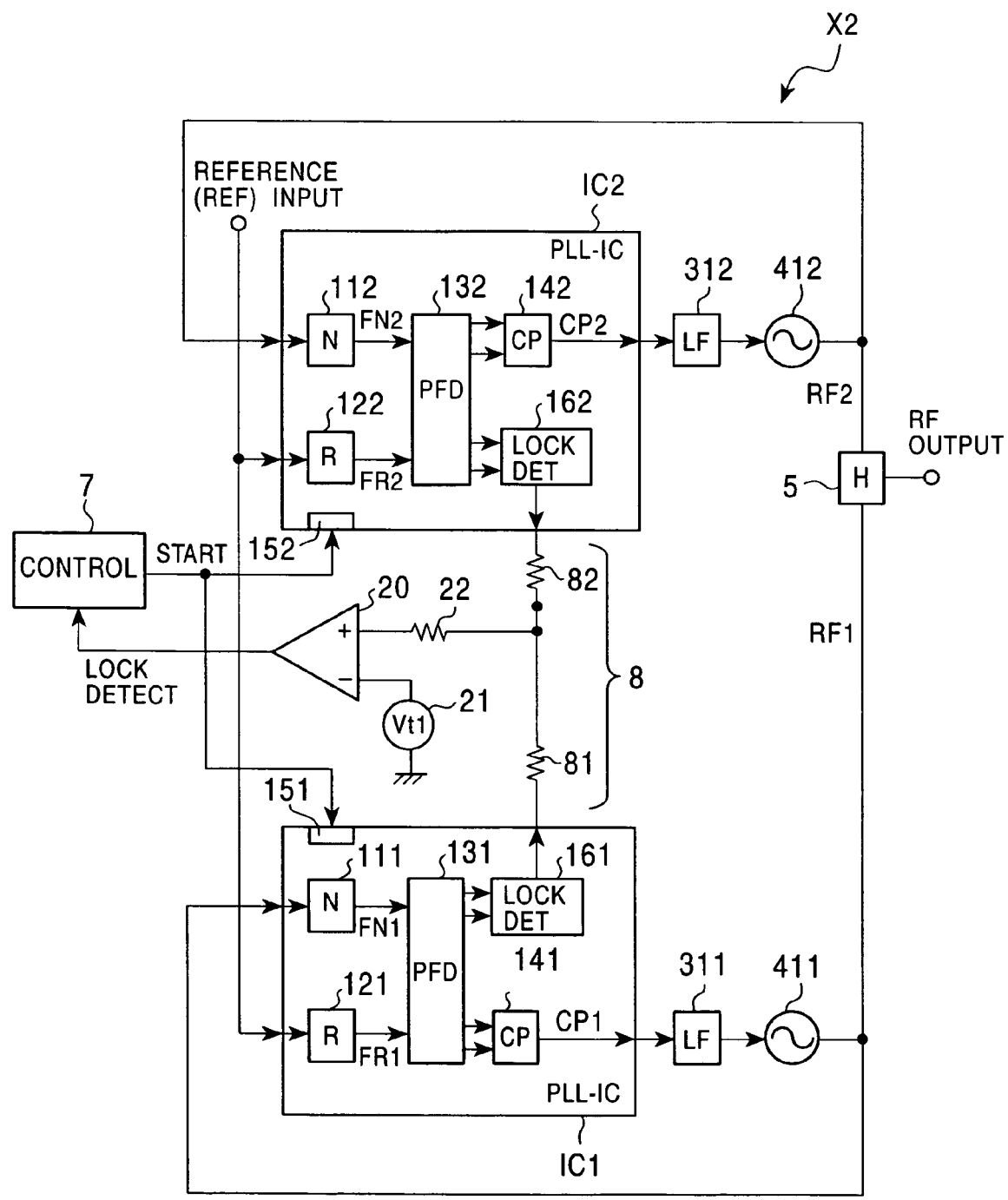
FIG. 18 is a schematic block diagram of an oscillator X2 according to a second embodiment of the present invention.

FIG. 18 is a block diagram showing the schematic configuration of an oscillator X2 according to a second embodiment of the present invention.

Unlike the oscillator X1, the oscillator X2 does not output the composite control command signal VLF to the single voltage-controlled oscillator 410. Instead, the oscillator X2 includes loop filters 311 and 312 and voltage-controlled oscillators (oscillation means) 411 and 412, the number of which corresponds to the number of ICs (IC1 and IC2) (that is, the number of phase frequency detectors 131 and 132). The IC1 and IC2 in conjunction with the corresponding loop filters 311 and 312 and the voltage-controlled oscillators 411 and 412 function as independent feedback loops in parallel operation. A hybrid 5, which serves as an example of combining and outputting means, outputs RF generated by combining output signals RF1 and RF2 of the voltage-controlled oscillators 411 and 412.

Even with the case in which the output signals of the plural voltage-controlled oscillators 411 and 412 are combined and the composite signal is output to the outside, the phase noise is reduced to the same degree as in the first embodiment (oscillator X1).

Specifically, since pulsed signals, excluding phase noise, of the output signals RF1 and RF2 of the voltage-controlled oscillators 411 and 412 are in synchronization with REF (reference signal) (that is, the phases are locked), the signal level of the composite signal is the voltage sum.

Since phase jitter and phase noise of the output signals RF1 and RF2 of the voltage-controlled oscillators 411 and 412 are random, such phase jitter and phase noise are added or canceled when the output signals RF1 and RF2 are combined. The average phase jitter or phase noise of the composite signal generated by combining the output signals RF1 and RF2 is the power sum.

As a result, the signal-to-noise ratio increases, and the phase noise of the RF output is reduced (improved). Theoretically, the phase noise is improved by 3 dB in the case of parallel operation of two feedback loops.

In the oscillator X2, whether the phase noise is reduced sufficiently is determined on the basis of a lock signal of two input signals (FN and FR) to each of the plural phase frequency detectors, and the phase frequency detectors are reactivated repeatedly until the phase noise is reduced sufficiently. Specifically, as in the oscillator X1 (FIG. 15), the oscillator X2 includes the lock detection circuits 161 and 162 for the corresponding phase frequency detectors 131 and 132, the all-lock-on detection circuit 8, and the activation control circuit 7 for outputting frequency setting and reset signals to the IC1 and IC2.

Since the operation of the activation control circuit 7 is similar to that of the activation control circuit 7 of the oscillator X1 shown in FIGS. 16 and 17 (except for the processing in step S5), a description of the activation control circuit 7 is omitted.

When the oscillator X2 enters the steady operation state after the reset process is performed by the activation control circuit 7, the phase noise of the output signals of the phase frequency detectors 131 and 132 is reduced sufficiently, as shown in FIG. 13. As a result, the phase noise of the RF output (output of the hybrid 5) is reduced sufficiently.

What is claimed is:

1. An oscillator comprising
  a plurality of identical oscillation means formed to oscillate at an identical frequency and outputting a plurality of output signals with an identical output frequency and an identical phase;
  a plurality of identical dividers for dividing said output frequency from each oscillation means at an identical divide ratio;
  a plurality of identical phase frequency detectors, each phase frequency detector detecting the phase difference between two input signals, which are the output signal of the corresponding divider output and a common external reference signal, and outputting a control command signal for controlling the output frequency from each of the oscillation means;
  phase-synthesizing and outputting means for phase-synthesizing the plurality of output signals from the plurality of identical oscillation means and outputting a composite signal;
  lock detection means for detecting whether the two input signals are phase-locked to each other in each of said plurality of phase frequency detectors;
  activation means for activating said plurality of phase frequency detectors when it is determined by the lock detection means that the two input signals are not phase-locked to each other in all or at least a predetermined number of the plurality of phase frequency detectors;
  frequency dividers for at least some of said plurality of phase frequency detectors, the frequency dividers dividing the output signal and the reference signal to be obtained by each of said phase frequency detectors by predetermined division ratios; and
  division-ratio sequential setting means for setting, prior to the lock detection by said lock detection means, the division ratios of the frequency dividers corresponding to the output signal at a first preset frequency exceeding the upper limit frequency of an adjustable frequency range of the corresponding oscillation means and at a second preset frequency less than the lower limit frequency of the adjustable frequency range in a predetermined sequence and subsequently setting the division ratios of the frequency dividers corresponding to the output signal at the desired frequency.

2. The oscillator according to claim 1, further comprising filters arranged on individual power lines to said plurality of phase frequency detectors.

3. An oscillator comprising:
  a plurality of predetermined oscillation means for outputting a plurality of output signals;
  a plurality of phase frequency detectors, each phase frequency detector detecting the phase difference between two input signals, which are the output signal of the corresponding oscillation means and an external reference signal, and outputting a control command signal for controlling the output signal to achieve a desired frequency on the basis of the phase difference;
  combining and outputting means for combining the plurality of output signals from the plurality of predetermined oscillation means and outputting a composite signal;
  lock detection means for detecting whether the two input signals are phase-locked to each other in each of said plurality of phase frequency detectors;
  activation means for activating said plurality of phase frequency detectors when it is determined by the lock detection means that the two input signals are not phase-locked to each other in all or at least a predetermined number of the plurality of phase frequency detectors;
  frequency dividers for at least some of said plurality of phase frequency detectors, the frequency dividers dividing the output signal and the reference signal to be obtained by each of said phase frequency detectors by predetermined division ratios; and
  division-ratio sequential setting means for setting, prior to the lock detection by said lock detection means, the division ratios of the frequency dividers corresponding to the output signal at a first preset frequency exceeding the upper limit frequency of an adjustable frequency range of the corresponding oscillation means and at a second preset frequency less than the lower limit frequency of the adjustable frequency range in a predetermined sequence and subsequently setting the division ratios of the frequency dividers corresponding to the output signal at the desired frequency.

4. The oscillator according to claim 3, further comprising filters arranged on individual power lines to said plurality of phase frequency detectors.

5. The oscillator according to claim 3, wherein the plurality of output signals from the plurality of predetermined oscillation means share an identical phase.

* * * * *